(12) United States Patent
Jo et al.

(10) Patent No.: US 12,401,734 B2
(45) Date of Patent: Aug. 26, 2025

(54) DISPLAY DEVICE

(71) Applicant: SAMSUNG DISPLAY CO., LTD., Yongin-si (KR)

(72) Inventors: Jae Hyung Jo, Asan-si (KR); Ji Hun Ryu, Hwaseong-si (KR); Kwang Hyun Baek, Asan-si (KR); Jong In Baek, Hwaseong-si (KR); Su Yul Seo, Incheon (KR); Sung Ho Jin, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 18/772,493

(22) Filed: Jul. 15, 2024

(65) Prior Publication Data

US 2024/0371194 A1 Nov. 7, 2024

Related U.S. Application Data

(63) Continuation of application No. 18/174,699, filed on Feb. 27, 2023, now Pat. No. 12,067,801, which is a
(Continued)

(30) Foreign Application Priority Data

Aug. 17, 2020 (KR) .......................... 10-2020-0102891

(51) Int. Cl.
*G06V 40/13* (2022.01)
*H04M 1/02* (2006.01)
(Continued)

(52) U.S. Cl.
CPC ...... *G06V 40/1306* (2022.01); *G06V 40/1318* (2022.01); *H04M 1/0266* (2013.01);
(Continued)

(58) Field of Classification Search
CPC .......................... H04M 1/0266; H04M 1/026; G06V 40/1306; G06V 40/1318; G06V 40/12;
(Continued)

(56) References Cited

U.S. PATENT DOCUMENTS 10,593,737 B2 3/2020 Bok
10,691,921 B2 6/2020 Seo et al.
(Continued)

FOREIGN PATENT DOCUMENTS

CN 110799988 2/2020
KR 10-2016-0016969 A 2/2016
(Continued)

OTHER PUBLICATIONS

Extended European Search Report dated Jan. 5, 2022 in corresponding European Patent Application No. 21191443.7 (8 pages).
(Continued)

*Primary Examiner* — Premal R Patel
(74) *Attorney, Agent, or Firm* — F. CHAU & ASSOCIATES, LLC

(57) ABSTRACT

A display device includes a display panel, a metal plate disposed on a bottom surface of the display panel and configured to support the display panel, a filling member disposed on the bottom surface of the display panel, the filling member being disposed on the same level as the metal plate relative to the bottom surface of the display panel, and a material of the metal plate being different from a material of the filling member, a fingerprint sensor disposed on a bottom surface of the filling member, and a member-sensor bonding member disposed between the fingerprint sensor and the filling member to bond the fingerprint sensor to the filling member. A hardness of the filling member is greater than a hardness of the member-sensor bonding member.

20 Claims, 24 Drawing Sheets

Related U.S. Application Data continuation of application No. 17/404,210, filed on Aug. 17, 2021, now Pat. No. 11,594,061.

(51) Int. Cl.
  *H10K 50/87* (2023.01)
  *H10K 59/12* (2023.01)
  *H10K 59/40* (2023.01)
  *H10K 59/65* (2023.01)
  *H10K 59/80* (2023.01)

(52) U.S. Cl.
  CPC ............. *H10K 50/87* (2023.02); *H10K 59/12* (2023.02); *H10K 59/40* (2023.02); *H10K 59/65* (2023.02); *H10K 59/8794* (2023.02)

(58) Field of Classification Search
  CPC ........ H10K 50/87; H10K 59/12; H10K 59/40; H10K 59/65; H10K 59/8794; G06F 3/0412; G06F 3/043; G09F 9/301
  See application file for complete search history.

(56) References Cited

U.S. PATENT DOCUMENTS

| | | |
|---|---|---|
| 11,430,838 B2 | 8/2022 | Bok |
| 11,594,061 B2 | 2/2023 | Jo et al. |
| 2015/0071509 A1 | 3/2015 | Myers |
| 2017/0045918 A1 | 2/2017 | Han et al. |
| 2018/0293420 A1 | 10/2018 | Kim et al. |
| 2018/0341290 A1 | 11/2018 | Sim et al. |
| 2018/0373913 A1 | 12/2018 | Panchawagh et al. |
| 2019/0073505 A1* | 3/2019 | Kwon .................... H05K 1/028 |
| 2019/0087630 A1 | 3/2019 | Seo et al. |
| 2020/0194516 A1 | 6/2020 | Kim et al. |
| 2022/0050986 A1 | 2/2022 | Jo et al. |
| 2023/0230411 A1 | 7/2023 | Jo et al. |

FOREIGN PATENT DOCUMENTS

| | | |
|---|---|---|
| KR | 10-2018-0031511 A | 3/2018 |
| KR | 10-2018-0049484 A | 5/2018 |
| KR | 10-2019-0030907 A | 3/2019 |
| KR | 10-2019-0053367 A | 5/2019 |
| KR | 10-2019-0082363 A | 7/2019 |
| KR | 10-2019-0098534 A | 8/2019 |
| KR | 10-2020-0002048 A | 1/2020 |
| WO | WO2019203598 A1 | 10/2019 |

OTHER PUBLICATIONS

Extended European Search Report dated Dec. 19, 2023 in corresponding European Patent Application No. 23199228.0 (9 pages).
Office Action dated May 12, 2025 in corresponding Korean Patent Appln. No. 10-2020-0102891, in Korean, 6 pages.

* cited by examiner

DISPLAY DEVICE

CROSS-REFERENCE TO RELATED APPLICATION

This application is a continuation of U.S. application Ser. No. 18/174,699 filed on Feb. 27, 2023 which is a continuation of U.S. application Ser. No. 17/404,210 filed on Aug. 17, 2021, now issued as U.S. Pat. No. 11,594,061, which claims priority to Korean Patent Application No. 10-2020-0102891 filed on Aug. 17, 2020 in the Korean Intellectual Property Office, and all the benefits accruing therefrom under 35 U.S.C. 119, the contents of which in its entirety are herein incorporated by reference.

BACKGROUND

1. Technical Field

The present disclosure relates to a display device, more particularly, to a display device with a filling member.

2. Description of the Related Art

A display device is applied to various electronic devices such as a smartphone, a tablet, a notebook computer, a monitor, and a television (TV). With the recent advance of mobile communication technology, the use of portable electronic devices such as a smartphone, a tablet, and a notebook computer has increased enormously. Privacy information is stored in the portable electronic device. Accordingly, to protect the privacy information of the portable electronic device, fingerprint authentication in which a fingerprint as user's biometric information is used for authentication has been used. To this end, the display device may include a fingerprint sensor for fingerprint authentication.

The fingerprint sensor may be implemented as an optical sensor, an ultrasonic sensor, a capacitive sensor, or the like. The fingerprint sensor is disposed under a display panel of the display device, and several members may be disposed between the display panel and the fingerprint sensor. An incident signal emitted from the fingerprint sensor is reflected from the user's fingerprint and received back in the form of a reflected signal by the fingerprint sensor. The amount of attenuation of the incident signal and the reflected signal may vary depending on the physical properties of the several members which are present between the fingerprint sensor and the display panel.

SUMMARY

Aspects of the present disclosure provide a display device including a fingerprint sensor with improved reliability.

According to an embodiment of the present inventive concept, a display device includes a display panel, a metal plate disposed on a bottom surface of the display panel and configured to support the display panel, a filling member disposed on the bottom surface of the display panel, the filling member being disposed on the same level as the metal plate relative to the bottom surface of the display panel, and a material of the metal plate being different from a material of the filling member, a fingerprint sensor disposed on a bottom surface of the filling member, and a member-sensor bonding member disposed between the fingerprint sensor and the filling member to bond the fingerprint sensor to the filling member. A hardness of the filling member is greater than a hardness of the member-sensor bonding member.

According to an embodiment of the present inventive concept, a display device includes a display panel in which a main region, a sub-region having an area smaller than that of the main region, and a bending region are defined, the bending region being disposed between the main region and the sub-region, and a portion of the display panel in the main region and a portion of display panel in the sub-region overlapping each other in a thickness direction of the display device, a filling member disposed on a first surface of the display panel in the main region, a lower panel sheet disposed on a first surface of the filling member in the main region and on a first surface of the display panel in the main region, the lower panel sheet being provided with a sheet hole penetrating the lower panel sheet in the thickness direction of the display device, a fingerprint sensor disposed on the first surface of the filling member in the main region, and a member-sensor bonding member disposed between the fingerprint sensor and the first surface of the filling member to bond the fingerprint sensor to the filling member. The sheet hole of the lower panel sheet exposes an inner side surface of the lower panel sheet. The fingerprint sensor overlaps, in the thickness direction of the display device, a first region defined by the sheet hole. A hardness of the filling member is greater than a hardness of the member-sensor bonding member.

However, aspects of the present disclosure are not limited to the one set forth herein. The above and other aspects of the present disclosure will become more apparent to one of ordinary skill in the art to which the present disclosure pertains by referencing the detailed description of the present disclosure given below.

In accordance with the display device including the fingerprint sensor according to embodiments, it is possible to improve the reliability of the fingerprint sensor.

The effects of the present disclosure are not limited to the aforementioned effects, and various other effects are included in the present specification.

BRIEF DESCRIPTION OF THE DRAWINGS

The above and other aspects and features of the present disclosure will become more apparent by describing in detail embodiments thereof with reference to the attached drawings, in which.

DETAILED DESCRIPTION OF THE EMBODIMENTS

Figure 1:
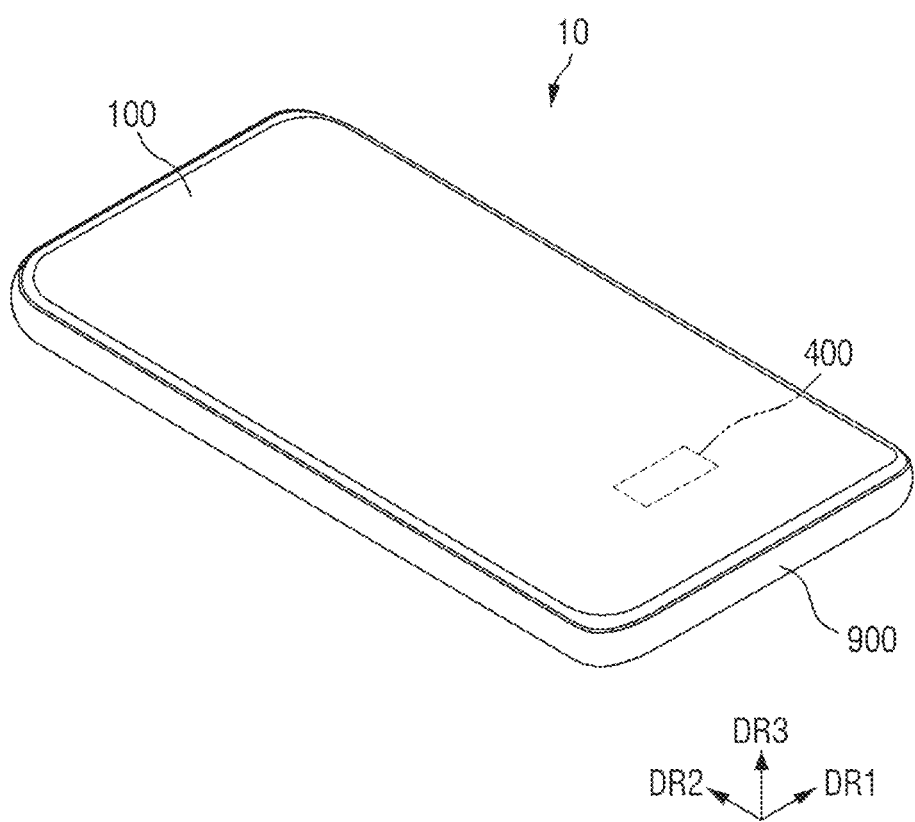
FIG. 1 is a perspective view illustrating a display device according to an embodiment of the present inventive concept.

Specific structural and functional descriptions of embodiments of the invention disclosed herein are only for illustrative purposes of the embodiments of the invention. The invention may be embodied in many different forms without departing from the spirit and significant characteristics of the invention. Therefore, the embodiments of the invention are disclosed only for illustrative purposes and should not be construed as limiting the invention. That is, the invention is only defined by the scope of the claims.

It will be understood that when an element is referred to as being related to another element such as being "coupled" or "connected" to another element, it can be directly coupled or connected to the other element or intervening elements may be present therebetween. In contrast, it should be understood that when an element is referred to as being related to another element such as being "directly coupled" or "directly connected" to another element, there are no intervening elements present. Other expressions that explain the relationship between elements, such as "between," "directly between," "adjacent to," or "directly adjacent to," should be construed in the same way.

Throughout the specification, the same reference numerals will refer to the same or like parts.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within +30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the invention will be described with reference to the attached drawings.

Figure 2:
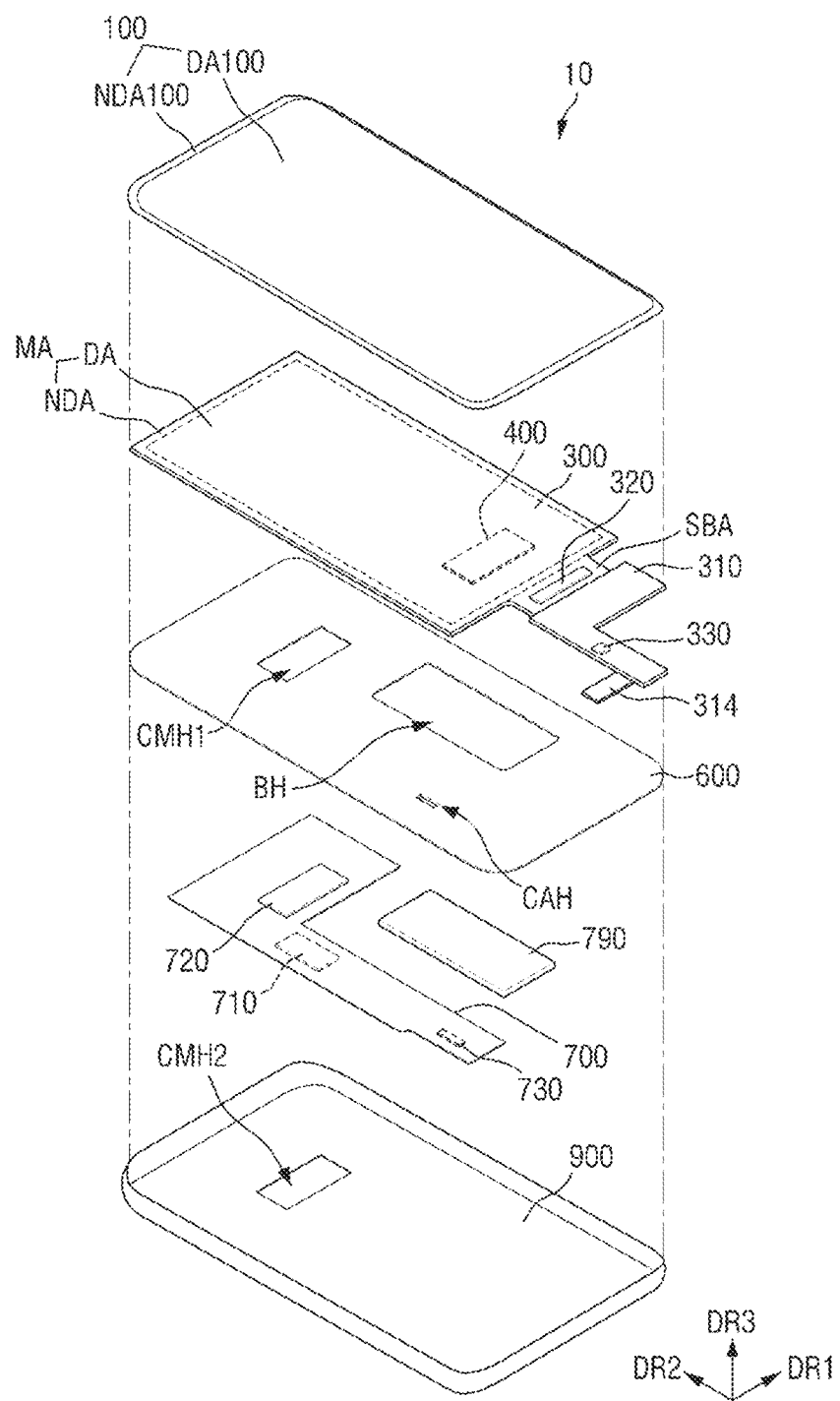
FIG. 2 is an exploded perspective view showing a display device according to an embodiment of the present inventive concept.

FIG. 1 is a perspective view illustrating a display device according to an embodiment. FIG. 2 is an exploded perspective view showing a display device according to an embodiment.

Referring to FIGS. 1 and 2, a display device 10 according to an embodiment may be applied to portable electronic devices such as a mobile phone, a smartphone, a tablet personal computer, a mobile communication terminal, an electronic organizer, an electronic book, a portable multimedia player (PMP), a navigation system, an ultra mobile PC (UMPC) or the like. Alternatively, the display device 10 according to an embodiment may be applied as a display unit of a television, a laptop, a monitor, a billboard, or an Internet-of-Things (IoT) terminal. Alternatively, the display device 10 according to an embodiment may be applied to wearable devices such as a smart watch, a watch phone, a glasses type display, or a head mounted display (HMD). Alternatively, the display device 10 according to an embodiment may be applied to a dashboard of a vehicle, a center fascia of a vehicle, a center information display (CID) disposed on a dashboard of a vehicle, a room mirror display in place of side mirrors of a vehicle, or a display disposed on a rear surface of a front seat for rear seat entertainment of a vehicle.

In the present disclosure, a first direction DR1 may be a short side direction of the display device 10, for example, a horizontal direction of the display device 10. A second direction DR2 may be a long side direction of the display device 10, for example, a vertical direction of the display device 10. A third direction DR3 may be a thickness direction of the display device 10. The third direction DR3 may also be referred to as the term "vertically".

The display device 10 may have a planar shape similar to a rectangular shape. For example, the display device 10 may have a planar shape similar to a rectangular shape having short sides in the first direction DR1 and long sides in the second direction DR2, as shown in FIG. 1. A corner where the short side in the first direction DR1 and the long side in the second direction DR2 meet may be right-angled or rounded with a predetermined curvature. The planar shape of the display device 10 is not limited to a rectangular shape, and may be formed in a shape similar to another polygonal shape, a circular shape, or elliptical shape.

The display device 10 may be formed flat. Alternatively, the display device 10 may be formed such that two sides facing each other are bendable. For example, the display device 10 may be formed such that the left and right sides are bendable. Alternatively, the display device 10 may be formed such that all of the upper, lower, left, and right sides are bendable.

The display device 10 according to an embodiment includes a cover window 100, a display panel 300, a display circuit board 310, a display driving circuit 320, a fingerprint sensor 400, a bracket 600, a main circuit board 700, and a lower cover 900.

The cover window 100 may be disposed above the display panel 300 to cover the front surface of the display panel 300. Accordingly, the cover window 100 may function to protect the top surface of the display panel 300. For user authentication, a user's finger may touch a region of the cover window 100.

The cover window 100 may include a light transmitting portion DA100 corresponding to the display panel 300 and a light blocking portion NDA100 corresponding to an area other than the display panel 300. The light blocking portion NDA100 may be formed to be opaque. Alternatively, the light blocking portion NDA100 may be formed as a decorative layer having a pattern that can be displayed to the user when an image is not displayed.

The display panel 300 may be disposed below the cover window 100. The display panel 300 may be a light emitting display panel including a light emitting element. For example, the display panel 300 may be an organic light emitting display panel using an organic light emitting diode including an organic light emitting layer, a micro light emitting diode display panel using a micro LED, a quantum dot light emitting display panel using a quantum dot light emitting diode including a quantum dot light emitting layer, or an inorganic light emitting display panel using an inorganic light emitting element including an inorganic semiconductor. The following description is directed to the case where the display panel 300 is an organic light emitting display panel.

The display panel 300 may include a main region MA and a sub-region SBA.

The main region MA may include a display area DA displaying an image and a non-display area NDA that is a peripheral area of the display area DA. The display area DA may include display pixels ('SP' in FIG. 3) for displaying an image. The non-display area NDA may be defined as an area from the boundary of the display area DA to the edge of the display panel 300.

The display area DA may include a fingerprint sensing area. The fingerprint sensing area indicates an area where the fingerprint sensor 400 is disposed. The fingerprint sensing area may be a partial area of the display area DA as shown in FIG. 2. The fingerprint sensor 400 may include, for example, an optical fingerprint sensor, an ultrasonic fingerprint sensor, or a capacitive fingerprint sensor. The following description is directed to the case where an ultrasonic fingerprint sensor is applied as the fingerprint sensor 400.

The planar shape of the main region MA of the display panel 300 may be a rectangular shape. For example, the planar shape of the main region MA may have a rectangular shape with right-angled corners. However, the present disclosure is not limited thereto, and the planar shape of the main region MA may be a rectangular shape having rounded corners.

The sub-region SBA may protrude from one side of the main region MA in the second direction DR2. The length of the sub-region SBA in the first direction DR1 may be smaller than the length of the main region MA in the first direction DR1, and the length of the sub-region SBA in the second direction DR2 may be smaller than the length of the main region MA in the second direction DR2, but the present disclosure is not limited thereto.

Although it is exemplarily shown in FIG. 2 that the sub-region SBA is stretched, the sub-region SBA may be bent and, in this case, arranged on the bottom surface of the display panel 300. In the case where the sub-region SBA is bent, it may overlap the main region MA in the thickness direction DR3 of the substrate SUB. The display circuit board 310 and the display driving circuit 320 may be disposed in the sub-region SBA.

The display circuit board 310 may be attached to one end of the sub-region SBA of the display panel 300 with a conductive adhesive member such as an anisotropic conductive film. As a consequence, the display circuit board 310 may be electrically connected to the display panel 300 and the display driving circuit 320. The display panel 300 and the display driving circuit 320 may receive digital video data, timing signals, and driving voltages via the display circuit board 310. The display circuit board 310 may be a flexible printed circuit board, a printed circuit board, or a flexible film such as a chip on film.

The display driving circuit 320 may generate signals and voltages for driving the display panel 300. The display driving circuit 320 may be formed as an integrated circuit (IC) and attached to the sub-region SBA of the display panel 300 by a chip on glass (COG) method, a chip on plastic (COP) method, or an ultrasonic bonding method, but the present disclosure is not limited thereto. For example, the display driving circuit 320 may be attached to the display circuit board 310 by a chip on film (COF) method.

A touch driving circuit 330 may be disposed on the display circuit board 310. The touch driving circuit 330 may be formed as an integrated circuit and attached to the top surface of the display circuit board 310.

Further, a power supply unit may be additionally disposed on the display circuit board 310 to supply display driving voltages for driving the display driving circuit 320.

The fingerprint sensor 400 may be disposed on the bottom surface of the display panel 300. The fingerprint sensor 400 may be attached to the bottom surface of the display panel 300 using a fifth bonding member to be described later. For example, the fifth bonding member may be a transparent adhesive resin such as optically clear resin (OCR).

The bracket 600 may be disposed under the display panel 300. The bracket 600 may include or may be formed of plastic, metal, or both plastic and metal. A first camera hole CMH1 into which a first camera sensor 720 is inserted, a battery hole BH in which a battery is disposed, and a cable hole CAH through which a cable 314 connected to the display circuit board 310 passes may be formed in the bracket 600.

The main circuit board 700 and a battery 790 may be disposed under the bracket 600. The main circuit board 700 may be a printed circuit board or a flexible printed circuit board.

The main circuit board 700 may include a main processor 710, a first camera sensor 720, and a main connector 730. The first camera sensor 720 may be disposed on both the top and bottom surfaces of the main circuit board 700, the main processor 710 may be disposed on the top surface of the main circuit board 700, and the main connector 730 may be disposed on the bottom surface of the main circuit board 700.

The main processor 710 may control all functions of the display device 10. For example, the main processor 710 may output digital video data to the display driving circuit 320 through the display circuit board 310 such that the display panel 300 displays an image. Further, the main processor 710 may receive touch data from the touch driving circuit 330 and determine the user's touch coordinates, and then execute an application indicated by an icon displayed on the user's touch coordinates. Furthermore, the main processor 710 may convert first image data inputted from the first camera sensor 720 into digital video data and outputs it to the display driving circuit 320 through the display circuit board 310, thereby displaying an image captured by the first camera sensor 720 on the display panel 300.

The first camera sensor 720 may process an image frame of a still image or video obtained by the image sensor and output it to the main processor 710. The first camera sensor 720 may be a complementary metal-oxide-semiconductor (CMOS) image sensor or a charge-coupled device (CCD) sensor. The first camera sensor 720 may be exposed to the bottom surface of the lower cover 900 by a second camera hole CMH2 to thereby capture an image of a background or an object disposed below the display device 10.

The cable 314 passing through the cable hole CAH of the bracket 600 may be connected to the main connector 730. Thus, the main circuit board 700 may be electrically connected to the display circuit board 310.

The battery 790 may be disposed so as not to overlap the main circuit board 700 in the third direction DR3. The battery 790 may overlap the battery hole BH of the bracket 600. In addition, the fingerprint sensor 400 may also overlap the battery hole BH of the bracket 600.

The main circuit board 700 may be further equipped with a mobile communication module capable of transmitting and receiving radio signals with at least one of a base station, an external terminal, and a server in a mobile communication network. The radio signal may include various types of data according to transmission and reception of a voice signal, a video call signal, or a text/multimedia message.

The lower cover 900 may be disposed below the main circuit board 700 and the battery 790. The lower cover 900 may be fixed by being fastened to the bracket 600. The lower cover 900 may form an external appearance of the bottom surface of the display device 10. The lower cover 900 may include or may be formed of plastic, metal, or both plastic and metal.

The second camera hole CMH2 exposing the bottom surface of the first camera sensor 720 may be formed in the lower cover 900. The position of the first camera sensor 720 and the positions of the first and second camera holes CMH1 and CMH2 corresponding to the first camera sensor 720 are not limited to the embodiment illustrated in FIG. 2.

Figure 3:
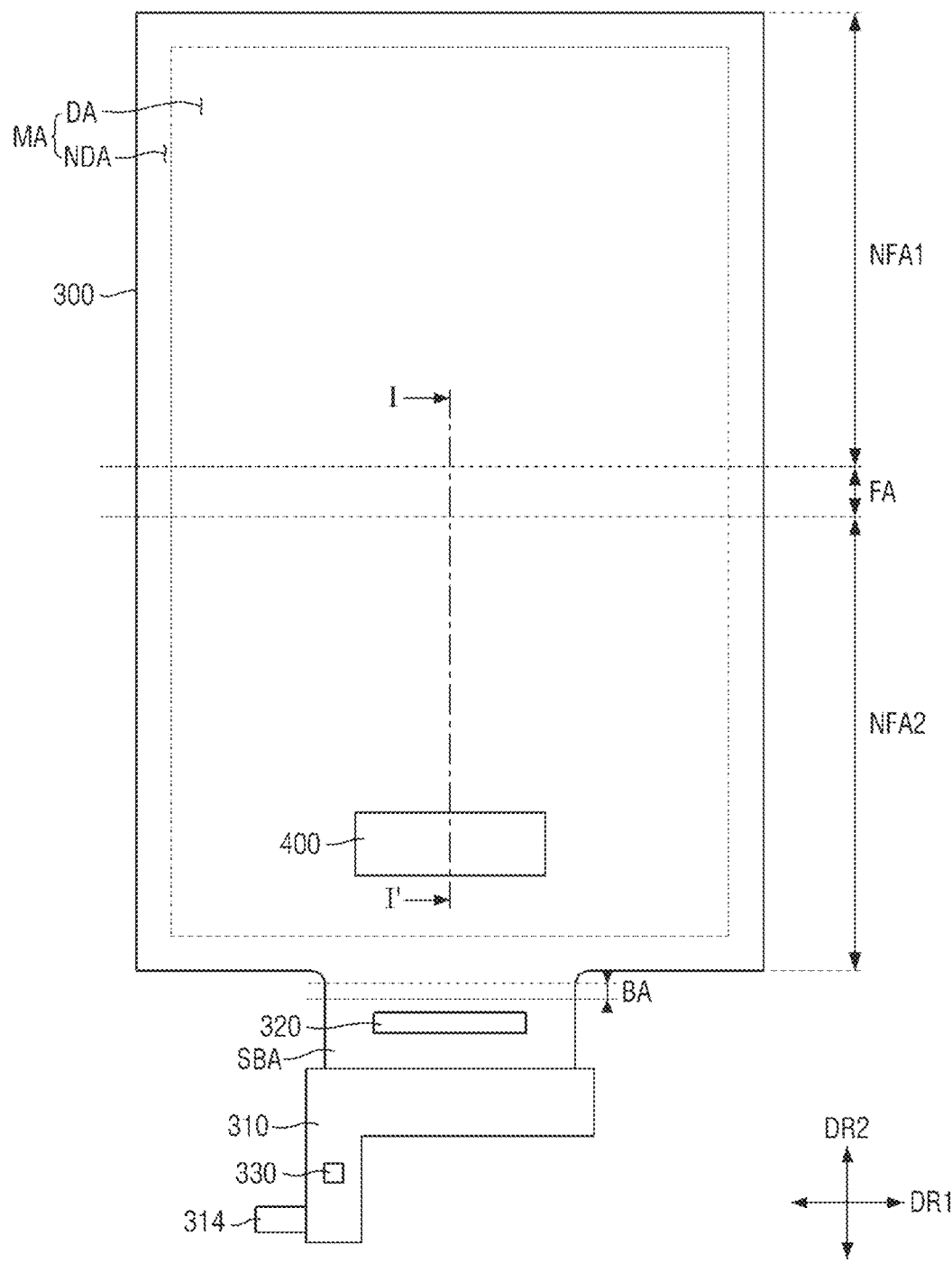
FIG. 3 is a plan view illustrating a display panel, a display circuit board, and a display driving circuit of FIG. 2 according to an embodiment of the present inventive concept.

FIG. 3 is a plan view illustrating a display panel, a display circuit board, and a display driving circuit of FIG. 2.

Referring to FIG. 3, a folding area FA and non-folding areas NFA1 and NFA2 may be further defined in the display device. The folding area FA may have a line shape extending along the first direction DR1. The first non-folding area NFA1 may be located on one side of the folding area FA in the second direction DR2, and the second non-folding area NFA2 may be located on the other side of the folding area FA in the second direction DR2. The area of each of the non-folding areas NFA1 and NFA2 may be larger than the area of the folding area FA, but is not limited thereto.

The display device may be a foldable display device that may be folded and unfolded with respect to the folding area FA in a state where the non-folding areas NFA1 and NFA2 are unfolded. The display device is an in-foldable display device which is in-folded such that the top surface of the first non-folding area NFA1 of the display device and the top surface of the second non-folding area NFA2 of the display device face each other with respect to the folding area FA, or an out-foldable display device which is out-folded such that the bottom surface of the first non-folding area NFA1 of the display device and the bottom surface of the second non-folding area NFA2 of the display device face each other with respect to the folding area FA.

Figure 4:
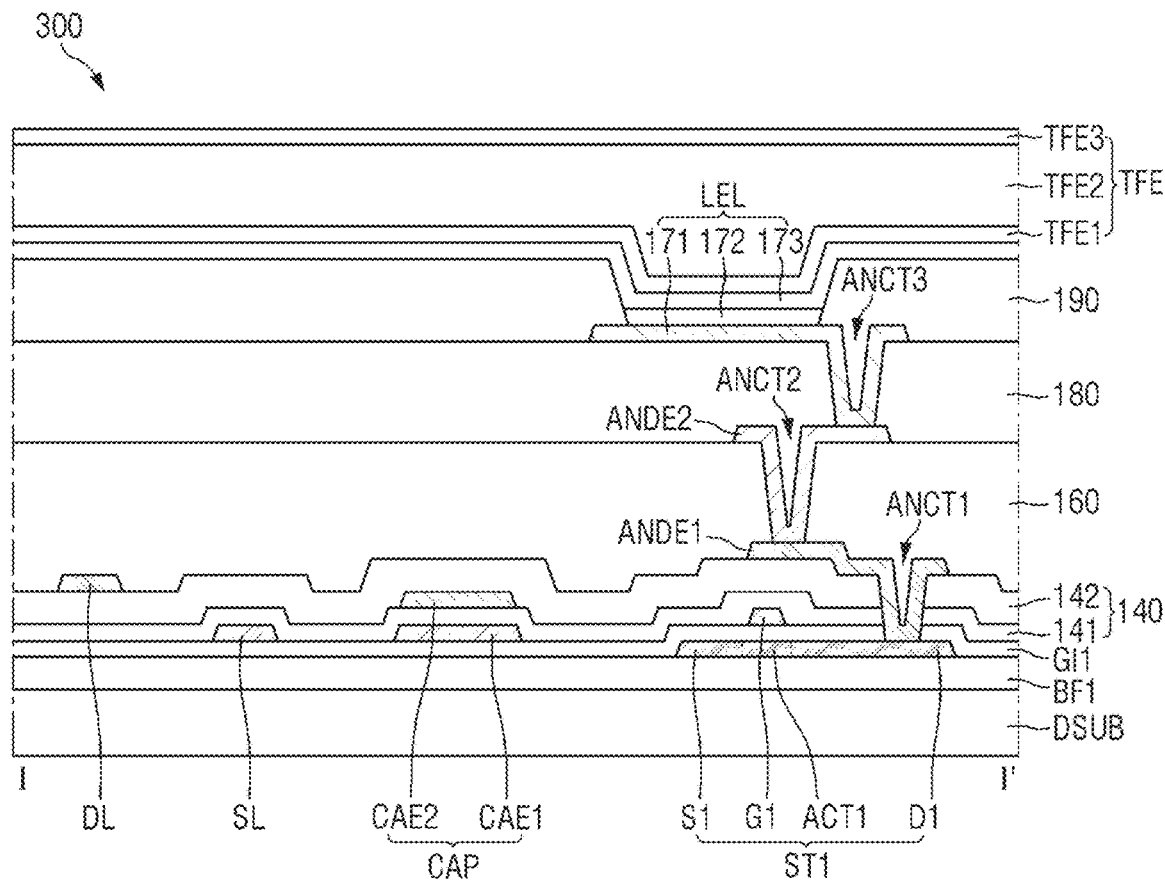
FIG. 4 is an exemplary cross-sectional view of the display panel of FIG. 3 according to an embodiment of the present inventive concept.

The fingerprint sensor 400 may be disposed in the second non-folding area NFA2, as illustrated in FIG. 3. However, the present disclosure is not limited thereto, and the fingerprint sensor 400 may be disposed in the first non-folding area NFA1 or in the folding area FA. FIG. 4 is an exemplary cross-sectional view of the display panel of FIG. 3.

Referring to FIG. 4, the display panel 300 may include display pixels for displaying an image. Each of the display pixels SP may include a light emitting element LEL, a first thin film transistor ST1, and a capacitor CAP.

The display substrate DSUB may be made of an insulating material such as glass, or polymer resin. For example, the display substrate DSUB may include or may be formed of polyimide. The display substrate DSUB may be a flexible substrate which can be bent, folded or rolled.

The display substrate DSUB may include, for example, a plurality of organic layers and a plurality of inorganic layers. For example, the display substrate DSUB may include a first organic layer, a first barrier layer disposed on the first organic layer and including at least one inorganic layer, a second organic layer disposed on the first barrier layer, and a second barrier layer disposed on the second organic layer and including at least one inorganic layer.

A first buffer layer BF1 may be disposed on the display substrate DSUB. The first buffer layer BF1 is a layer for protecting thin film transistors of the thin film transistor layer TFTL and a light emitting layer 172 of the light emitting element layer EML from moisture permeating through the display substrate DSUB which is susceptible to moisture permeation. The first buffer layer BF1 may be formed of a plurality of inorganic layers that are alternately stacked. For example, the first buffer layer BF1 may be formed of multiple layers in which one or more inorganic layers of a silicon nitride layer, a silicon oxynitride layer, a silicon oxide layer, a titanium oxide layer and an aluminum oxide layer are alternately stacked.

A first active layer ACT1, a first source electrode S1, and a first drain electrode D1 of the first thin film transistor ST1 may be disposed on the first buffer layer BF1. The first active layer ACT1 of the first thin film transistor ST1 includes polycrystalline silicon, monocrystalline silicon, low-temperature polycrystalline silicon, amorphous silicon, or an oxide semiconductor. The first source electrode S1 and the first drain electrode D1 may have conductivity by doping a silicon semiconductor or an oxide semiconductor with ions or impurities. The first active layer ACT1 overlaps a first gate electrode G1 in the third direction DR3 which is the thickness direction of the display substrate DSUB, and the first source electrode S1 and the first drain electrode D1 may not overlap the first gate electrode G1 in the third direction DR3.

A first gate insulating layer GI1 may be disposed on the first active layer ACT1 of the first thin film transistor ST1. The first gate insulating layer GI1 may be formed of an inorganic layer, for example, a silicon nitride layer, a silicon oxynitride layer, a silicon oxide layer, a titanium oxide layer, or an aluminum oxide layer.

A scan line SL, a first capacitor electrode CAE1, and a first gate electrode G1 of the first thin film transistor ST1 may be disposed on the first gate insulating layer GI1. The first gate electrode G1 may overlap the first active layer ACT1 in the third direction DR3. The scan line SL may be electrically connected to the first gate electrode G1. The first capacitor electrode CAE1 may overlap a second capacitor electrode CAE2 in the third direction DR3. The first gate electrode G1 and the scan line SL may be formed as a single layer or multiple layers made of any one of molybdenum (Mo), aluminum (Al), chromium (Cr), gold (Au), titanium (Ti), nickel (Ni), neodymium (Nd) and copper (Cu) or an alloy thereof.

A first interlayer insulating layer 141 may be disposed on the first gate electrode G1 and the first capacitor electrode CAE1. The first interlayer insulating layer 141 may be formed of an inorganic layer, for example, a silicon nitride layer, a silicon oxynitride layer, a silicon oxide layer, a titanium oxide layer, or an aluminum oxide layer.

The second capacitor electrode CAE2 may be disposed on the first interlayer insulating layer 141. Because the first interlayer insulating layer 141 has a predetermined dielectric constant, a capacitor CAP may be formed by the first and second capacitor electrodes CAE1 and CAE2 and the first interlayer insulating layer 141 disposed between the first and second capacitor electrodes CAE1 and CAE2. The second capacitor electrode CAE2 may be formed as a single layer or multiple layers made of any one of molybdenum (Mo), aluminum (Al), chromium (Cr), gold (Au), titanium (Ti), nickel (Ni), neodymium (Nd) and copper (Cu) or an alloy thereof.

A second interlayer insulating layer 142 may be disposed on the second capacitor electrode CAE2. The second interlayer insulating layer 142 may be formed of an inorganic layer, for example, a silicon nitride layer, a silicon oxynitride layer, a silicon oxide layer, a titanium oxide layer, or an aluminum oxide layer. The second interlayer insulating layer 142 may include may be formed of a plurality of inorganic layers.

A first pixel connection electrode ANDE1 and a data line DL may be disposed on the second interlayer insulating layer 142. The first pixel connection electrode ANDE1 may penetrate the first interlayer insulating layer 141 and the second interlayer insulating layer 142 to be connected to the first drain electrode D1 of the first thin film transistor ST1 via a first pixel contact hole ANCT1 that exposes the first drain electrode D1 of the first thin film transistor ST1. The first pixel connection electrode ANDE1 may be formed as a single layer or multiple layers made of any one of molybdenum (Mo), aluminum (Al), chromium (Cr), gold (Au), titanium (Ti), nickel (Ni), neodymium (Nd) and copper (Cu) or an alloy thereof.

A first organic layer 160 for planarization may be disposed on the first pixel connection electrode ANDE1. The first organic layer 160 may be formed of acryl resin, epoxy resin, phenolic resin, polyamide resin, polyimide resin, or the like.

A second pixel connection electrode ANDE2 may be disposed on the first organic layer 160. The second pixel connection electrode ANDE2 may be connected to the first pixel connection electrode ANDE1 via a second pixel contact hole ANCT2 penetrating the first organic layer 160 to expose the first pixel connection electrode ANDE1. The second pixel connection electrode ANDE2 may be formed as a single layer or multiple layers made of any one of molybdenum (Mo), aluminum (Al), chromium (Cr), gold (Au), titanium (Ti), nickel (Ni), neodymium (Nd) and copper (Cu) or an alloy thereof.

A second organic layer 180 may be disposed on the second pixel connection electrode ANDE2. The second organic layer 180 may be formed of acryl resin, epoxy resin, phenolic resin, polyamide resin, polyimide resin, or the like.

Meanwhile, in an embodiment, the second pixel connection electrode ANDE2 and the second organic layer 180 may be omitted. In this case, the first pixel connection electrode ANDE1 may be directly connected to a light emitting pixel electrode 171.

Although FIG. 4 illustrates that the first thin film transistor ST1 is formed by a top gate method in which the first gate electrode G1 is located above the first active layer ACT1, the present disclosure is not limited thereto. The first thin film transistor ST1 may be formed by a bottom gate method in which the first gate electrode G1 is located below the first active layer ACT1, or a double gate method in which the first gate electrode G1 is located both above and below the first active layer ACT1.

The light emitting elements LEL and a bank 190 may be disposed on the second organic layer 180. Each of the light emitting elements LEL includes a light emitting pixel electrode 171, a light emitting layer 172, and a light emitting common electrode 173.

The light emitting pixel electrode 171 may be formed on the second organic layer 180. The light emitting pixel electrode 171 may be connected to the second pixel connection electrode ANDE2 via a third pixel contact hole ANCT3 penetrating the second organic layer 180 to expose the second pixel connection electrode ANDE2.

In a top emission structure in which light is emitted toward the light emitting common electrode 173 when viewed with respect to the light emitting layer 172, the light emitting pixel electrode 171 may be formed of a metal material having high reflectivity to have a stacked structure (Ti/Al/Ti) of aluminum and titanium, a stacked structure (ITO/Al/ITO) of aluminum and ITO, an APC alloy, and a stacked structure (ITO/APC/ITO) of an APC alloy and ITO. The APC alloy is an alloy of silver (Ag), palladium (Pd) and copper (Cu).

The bank 190 may be formed to delimit the light emitting pixel electrode 171 on the second organic layer 180 to define an emission area EA. The bank 190 may be formed to cover the edge of the light emitting pixel electrode 171. The bank 190 may be formed of an organic layer such as acryl resin, epoxy resin, phenolic resin, polyamide resin, polyimide resin and the like.

The emission area EA is an area in which the light emitting pixel electrode 171, the light emitting layer 172, and the light emitting common electrode 173 are sequentially stacked such that the holes from the light emitting pixel electrode 171 and the electrons from the light emitting common electrode 173 are combined with each other to emit light.

The light emitting layer 172 is formed on the light emitting pixel electrode 171 and the bank 190. The light emitting layer 172 may include or may be formed of an organic material to emit light in a predetermined color. For example, the light emitting layer 172 includes a hole transporting layer, an organic material layer, and an electron transporting layer.

The light emitting common electrode 173 is formed on the light emitting layer 172. The light emitting common electrode 173 may be formed to cover the light emitting layer 172. The light emitting common electrode 173 may be a common layer formed in common on all emission areas EA. A capping layer may be formed on the light emitting common electrode 173.

In the top emission structure, the light emitting common electrode 173 may be formed of transparent conductive oxide (TCE) such as indium tin oxide (ITO) and indium zinc oxide (IZO) capable of transmitting light or a semi-transmissive conductive material such as magnesium (Mg), silver (Ag), or an alloy of magnesium (Mg) and silver (Ag).

An encapsulation layer TFE may be disposed on the light emitting common electrode 173. The encapsulation layer TFE includes at least one inorganic layer to prevent oxygen or moisture from permeating into the light emitting element layer EML. In addition, the encapsulation layer TFE includes at least one organic layer to protect the light emitting element layer EML from foreign substances such as dust. For example, the encapsulation layer TFE includes a first encapsulation inorganic layer TFE1, an encapsulation organic layer TFE2, and a second encapsulation inorganic layer TFE3.

Figure 5:
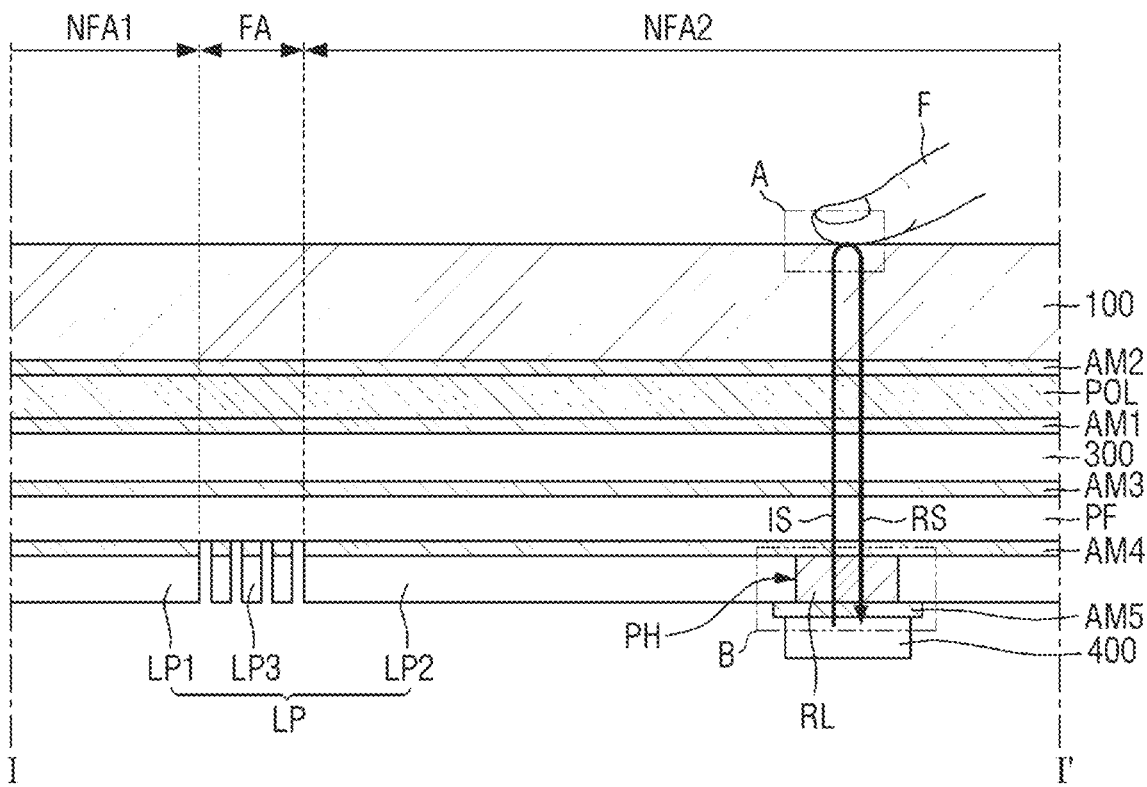
FIG. 5 is a cross-sectional view taken along line I-I' of FIG. 3 according to an embodiment of the present inventive concept.
Figure 6:
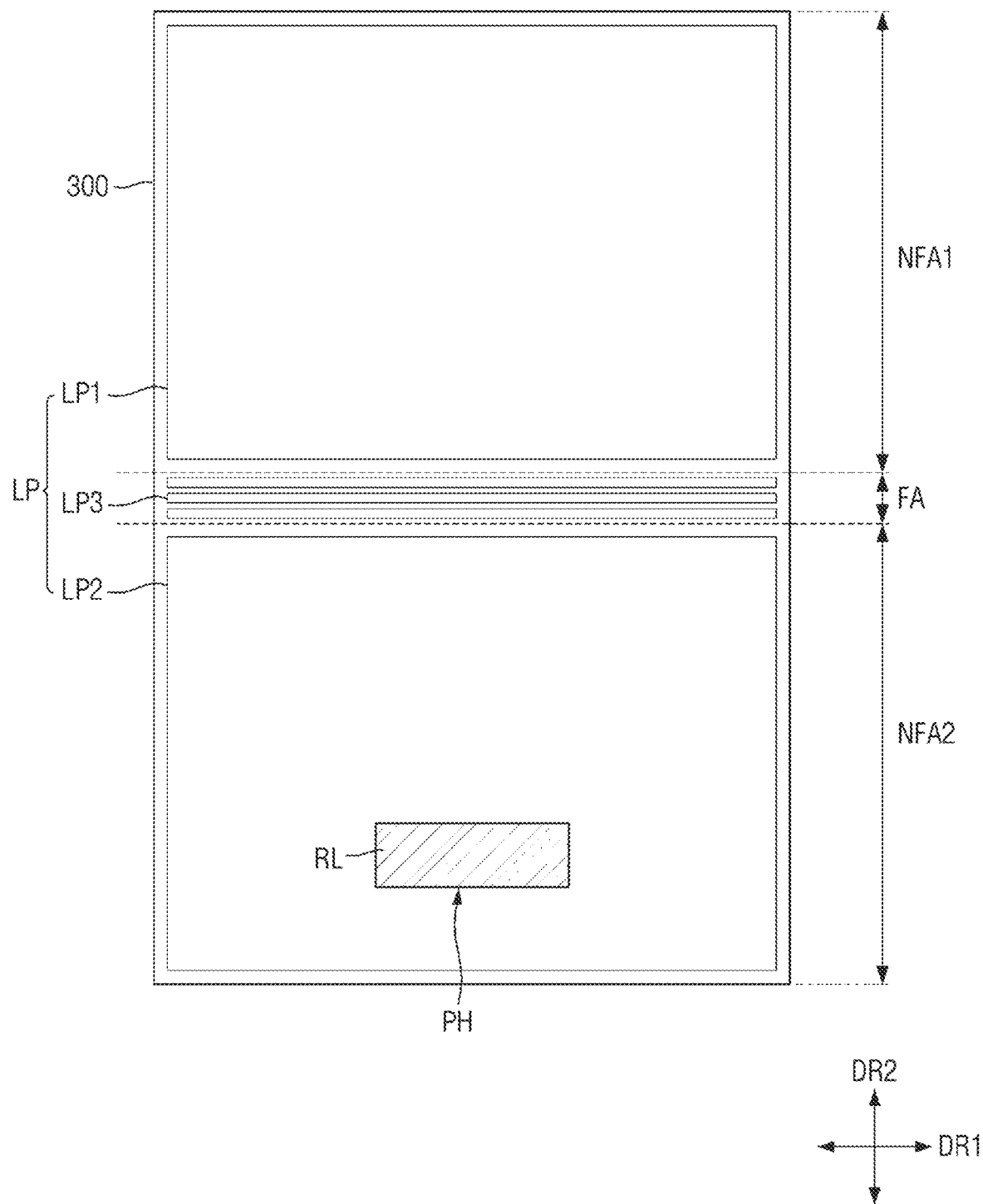
FIG. 6 is a plan view illustrating a lower metal sheet and a filling member according to an embodiment of the present inventive concept.

FIG. 5 is a cross-sectional view taken along line I-I' of FIG. 3. FIG. 6 is a plan view illustrating a lower metal sheet and a filling member according to an embodiment. FIG. 5 illustrates that a user touches the top surface of the cover window 100 with a finger F for fingerprint authentication.

Referring to FIG. 5, the display device may include a polarizing layer POL, the cover window 100, a metal plate LP, a filling member RL, and bonding members AM1 to AM5 that bond adjacent members.

The polarization layer POL may be disposed on the display panel 300. The polarization layer POL may be adhered to the top surface of the display panel 300 through the first bonding member AM1. The polarization layer POL serves to reduce reflection of external light incident through the cover window 100. The first bonding member AM1 may be a transparent adhesive resin such as an optically clear resin (OCR) or a transparent adhesive film such as an optically clear adhesive (OCA) film.

The cover window 100 may be disposed on the top surface of the polarization layer POL. The cover window 100 may be adhered to the top surface of the polarization layer POL through the second bonding member AM2. In some embodiments, the polarization layer POL may be omitted. In some embodiments where the polarization layer POL is omitted, color filters may be disposed between the cover window 100 and the display panel 300, and a black matrix may be disposed between adjacent color filters. The material of the second bonding member AM2 may be selected from the exemplified materials of the first bonding member AM1.

The protective layer PF may be disposed on the bottom surface of the display panel 300. The protective layer PF may include or may be formed of polyimide (PI), polyethylene terephthalate (PET), or the like, but is not limited to the exemplified materials. The protective layer PF may be adhered to the bottom surface of the display panel 300 through the third bonding member AM3.

The third bonding member AM3 may be a transparent adhesive resin such as an optically clear resin (OCR) or a transparent adhesive film such as an optically clear adhesive (OCA) film. When the display panel 300 according to an embodiment is a front emission type display panel, the light transmittance of the third bonding member AM3 may be lower than the light transmittance of the first and second bonding members AM1 and AM2 described above, but the present disclosure is not limited thereto.

The metal plate LP may be disposed under the protective layer PF. The metal plate LP may be adhered to the bottom surface of the protective layer PF through the fourth bonding member AM4. As shown in FIG. 6, the metal plate LP may include a first metal plate LP1 disposed in the first non-folding area NFA1, a second metal plate LP2 disposed in the second non-folding area NFA2, and a third metal plate LP3 disposed in the folding area FA. The third metal plate LP3 may be formed of a plurality of patterns spaced apart from each other in the second direction DR2. Each of the patterns may extend in the first direction DR1. The first and second metal plates LP1 and LP2 serve to support the display panel 300 thereabove in the non-folding areas NFA1 and NFA2, respectively. Each of the first and second metal plates LP1 and LP2 may have a whole pattern shape such as a plate. The metal plate LP may be made of metal or a metal alloy. For example, the metal plate LP may be made of an aluminum alloy or stainless steel (SUS), but the material is not limited thereto. In some embodiments, the third metal plate LP3 may be omitted. In the drawing, the first to third metal plates LP1, LP2, and LP3 are shown as being spaced apart from each other, but the present disclosure is not limited thereto, and the first to third metal plates LP1, LP2, and LP3 may be integrally formed and combined with each other.

Meanwhile, a through hole PH surrounded by materials forming the second metal plate LP2 may be further defined. In an embodiment, the second metal plate LP2 may be provided with the through hole PH which extends from a top surface of the second metal plate LP2 to a bottom surface of the second metal plate LP2. When the display panel 300 is viewed in a plan view, the through hole PH may be defined by materials forming the second metal plate LP2. The through hole PH may completely penetrate from the top surface of the second metal plate LP2 to the bottom surface of the second metal plate LP2 in the thickness direction. The filling member RL may be disposed in the through hole PH. When the display panel 300 is viewed in a plan view, the filling member RL may be completely surrounded by the second metal plate LP2. The filling member RL may be bonded to the bottom surface of the protective layer PF through the fourth bonding member AM4 and may be bonded to the fingerprint sensor 400 through the fifth bonding member AM5. The fourth bonding member AM4 may be selected from the exemplified materials of the third bonding member AM3 described above. In an embodiment, the filling member RL and the metal plate LP may be at the same level relative to the protective layer PF or the display panel 300.

The fifth bonding member AM5 may also be referred to as a member-sensor bonding member. The fingerprint sensor 400 may be disposed to overlap the filling member RL in the thickness direction. The fingerprint sensor 400 may be bonded to the bottom surface of the filling member RL and the bottom surface of the second metal plate LP2 through the fifth bonding member AM5. For example, the fifth bonding member AM5 may be a transparent adhesive resin such as optically clear resin (OCR). The resin may be, for example, an epoxy resin, but is not limited thereto.

Figure 7:
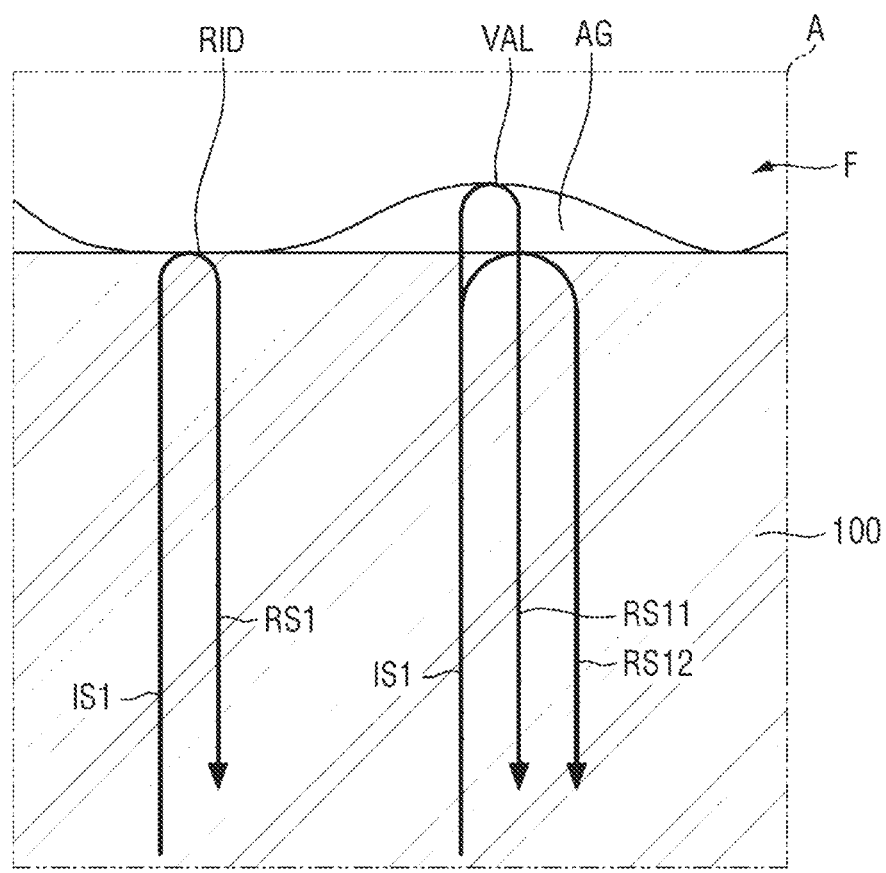
FIG. 7 is an enlarged cross-sectional view of area A of FIG. 5 according to an embodiment of the present inventive concept.

As shown in FIG. 5, the finger F with a fingerprint may face and touch the cover window 100. The fingerprint of the finger F may include depressions and prominences. The depressions and prominences of the fingerprint may be repeatedly disposed. In at least one section including one depression and one prominence taken among the repeated depressions and prominences, the prominence may be referred to as ridge RID and the depression may be referred to as valley VAL as shown in FIG. 7. The ridge RID of the fingerprint may be closer to the cover window 100 than the valley VAL of the fingerprint. An operation method of the ultrasonic fingerprint sensor will be described in detail with reference to FIG. 7.

In some embodiments, separate layers may be further disposed between the metal plate LP and the protective layer PF. The layers include at least one functional layer. The functional layer may be a layer that performs a heat dissipation function, an electromagnetic shielding function, a grounding function, a buffering function, a rigidity enhancing function, a supporting function, and/or a digitizing function.

FIG. 7 is an enlarged cross-sectional view of area A of FIG. 5.

Referring to FIGS. 5 and 7, a first ultrasonic wave IS1 travel to the ridge RID and the valley VAL of the fingerprint and then reflected by the ridge RID and the valley VAL. The first ultrasonic wave IS1 travelling toward the ridge RID may pass through the fifth bonding member AM5, the filling member RL, the fourth bonding member AM4, the protective layer PF, the third bonding member AM3, the display panel 300, the first bonding member AM1, the polarization layer POL, the second bonding member AM2, and the cover window 100 to reach the ridge RID. As shown in FIGS. 5 and 7, because the ridge RID is in direct contact with the cover window 100, no gap, e.g., air gap AG, is present between the ridge RID and the cover window 100. On the other hand, the first ultrasonic wave IS1 travelling toward the valley VAL may pass through the fifth bonding member AM5, the filling member RL, the fourth bonding member AM4, the protective layer PF, the third bonding member AM3, the display panel 300, the first bonding member AM1, the polarization layer POL, the second bonding member AM2, the cover window 100, and the air gap AG to reach the valley VAL. The first ultrasonic wave IS1 travelling toward the valley VAL may further pass through the air gap AG as compared to the first ultrasonic wave IS1 travelling toward the ridge RID. With regard to the first ultrasonic wave IS1 emitted by the ultrasonic fingerprint sensor 400, the first ultrasonic wave IS1 travelling to the ridge RID may be reflected by the ridge RID of the finger F as a first signal RS1. Further, the first ultrasonic wave IS1 travelling toward the valley VAL may be reflected by an interface between the air gap AG and the cover window 100 as a first reflection signal RS11, and the first ultrasonic wave IS1 travelling to the valley VAL may be reflected by valley VAL of the finger F as a second reflection signal RS12. The first and second reflection signals RS11 and RS12 constituting the first signal RS1. The magnitude of the first reflection signal RS11 may be greater than that of the second reflection signal RS12.

The ultrasonic fingerprint sensor 400 may recognize the ridge RID and the valley VAL based on a first time difference between an emission time point of the first ultrasonic wave IS1 and an arrival time point of the first signal RS1 reflected by the ridge RID and a second time difference between the emission time point of the first ultrasonic wave IS1 and an arrival time point of the first signal RS1 reflected by the valley VAL and the interface between the air gap AG and the cover window 100. However, given the existence of the air gap AG between the valley VAL and the cover window 100 and the ultrasonic wave propagation speed varying with medium, the ridge RID and the valley VAL may be difficult to be distinguished from each other.

To factor in the air gap AG between the valley VAL and the cover window 100 for more accurate distinction between the ridge RID and the valley VAL, a ratio between the strength of the first ultrasonic wave IS1 and the strength of the first signal RS1 may be calculated to distinguish the ridge RID and the valley VAL from each other. The ratio of the strength of the first signal RS1 to the strength of the first ultrasonic wave IS1 is defined as reflection coefficient. The reflection coefficient of the first ultrasonic wave IS1 irradiated to the valley VAL may be greater than the reflection coefficient of the first ultrasonic wave IS1 irradiated to the ridge RID. Whether it is the ridge RID or the valley VAL may be determined based on the reflection coefficient of the first ultrasonic wave IS1.

Referring back to FIG. 5, if the metal plate LP is disposed on the travelling path of the first ultrasonic wave IS1 emitted upward from the fingerprint sensor 400 and/or the first signal RS1 reflected from the fingerprint of the finger F, the signal strength of each of the first ultrasonic waves IS1 and the signal strength of the first signal RS1 may be reduced. In the display device according to an embodiment, the metal plate LP is cut to form a through hole PH which extends from the top surface of the metal plate LP to the bottom surface of the metal plate LP. The through hole PH may be located in the travelling path of the first ultrasonic wave IS1, and thus the signal strength of each of the first ultrasonic waves IS1 and the signal strength of the first signal RS1 is not reduced by the first metal plate LP.

Meanwhile, when the fingerprint sensor 400 is directly attached to the protective layer PF through the fourth bonding member AM4 in the through hole PH, due to an attachment pressure, the display panel 300 and the like overlapping the fingerprint sensor 400 in the thickness direction may be partially pressed in the upward direction, and the pressing may be visually recognized from the outside, causing a display failure. To avoid the pressing, when the fingerprint sensor 400 is attached to the bottom surface of the second metal plate LP2 adjacent to the through hole PH with the through hole PH interposed therebetween, the first ultrasonic wave IS1 emitted from the fingerprint sensor 400 may be subject to signal distortion due to the air gap in the through hole PH.

As a comparative example, a bonding member may fill the through hole PH and is attached to the bottom surface of the protective layer PF, and the fingerprint sensor 400 may be bonded through the bonding member filling the through hole PH to the protective layer PF. The protective layer PF and/or the display panel 300 may be pressed due to an insufficient hardness of the bonding member in such attachment process, and thus the failure due to the pressing arising from the attachment pressure still occurs.

In the display device according to an embodiment, the inside of the through hole PH is filled with the filling member RL having a much greater hardness than the fifth bonding member AM5, and the fingerprint sensor 400 is attached to the bottom surface of the filling member RL through the fifth bonding member AM5, thereby preventing defective pressing of the protective layer PF and/or the display panel 300, and visual recognition of the through hole PH. From the viewpoint of preventing defective pressing, the hardness of the filling member RL may be about 10 times or more the hardness of the fifth bonding member AM5. In an embodiment, the hardness of the filling member RL may be 20 times or 30 times or more the hardness of the fifth bonding member AM5. For example, the hardness of the filling member RL may be 0.8 Gps or more, but is not limited thereto. The filling member RL may include materials which fills the through hole PH. For example, the filling member RL may include or may be formed of a material that fills the through hole PH by an injection method or an adhesion method. The filling member RL may be made of acrylonitrile butadiene styrene copolymer (ABS), polycarbonate (PC), or the like, although not limited thereto. The hardness of the filling member RL may be smaller than that of the adjacent second metal plate LP2.

The filling member RL is located on the path of the first ultrasonic wave IS1 emitted from the fingerprint sensor 400, and the first ultrasonic wave IS1 may have a frequency band in which the ultrasonic wave is allowed to easily pass through the display panel 300. To increase the sensing efficiency of the fingerprint sensor 400, the filling member RL may have an impedance similar to that of the display panel 300. For example, the impedance of the filling member RL may be set within an error of about 5 MPa*m/s*10^-6 of the impedance of the display panel 300.

In some other embodiments, when the ultrasonic fingerprint sensor is applied, the filling member RL may further include a black colorant. Since the filling member RL further includes a black colorant, it is possible to prevent the fingerprint sensor 400 from being visually recognized from the outside.

When the optical fingerprint sensor is applied as the fingerprint sensor 400, the filling member RL may have the same hardness and material as the filling member RL when the ultrasonic fingerprint sensor is applied. However, since the optical fingerprint sensor recognizes a fingerprint through light, the filling member RL may be designed in consideration of the transmittance of the corresponding light. When the optical fingerprint sensor is applied, the filling member RL may have a transmittance of about 90% or more for the light. The light may include visible light, ultraviolet light, or infrared light.

Figure 8:
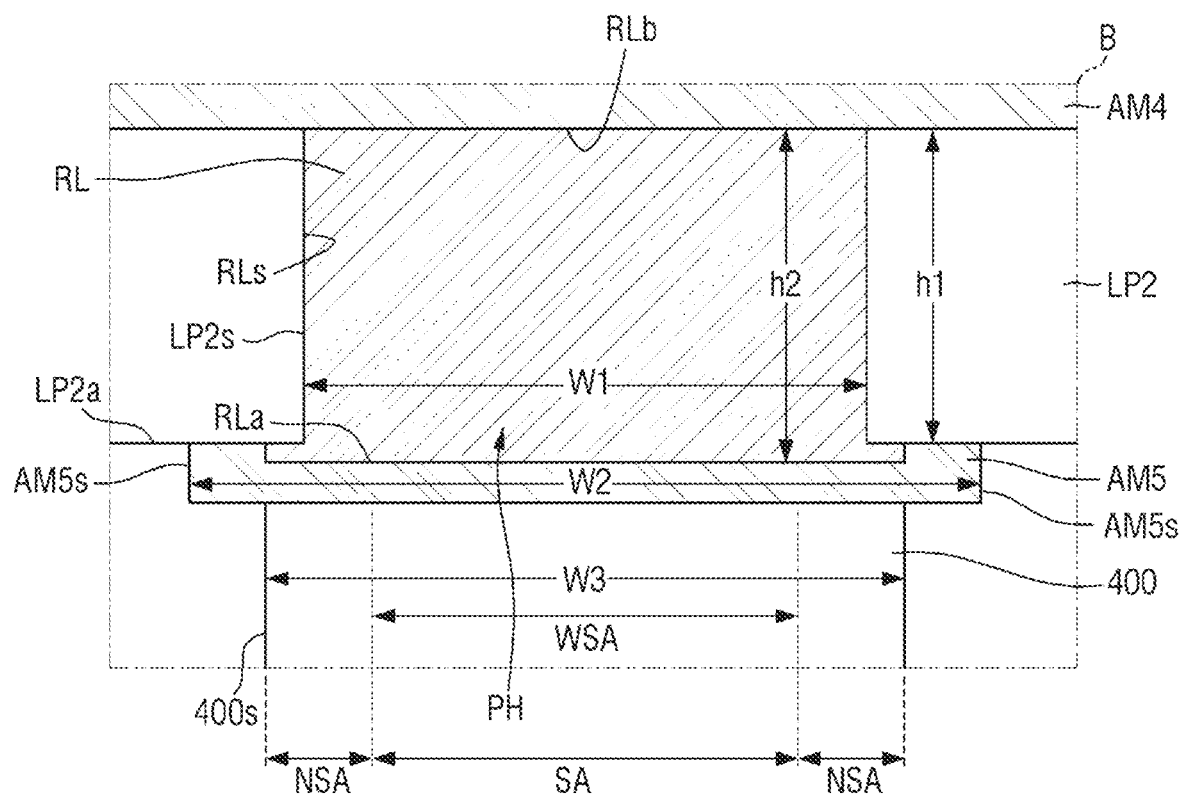
FIG. 8 is an enlarged cross-sectional view of area B of FIG. 5 according to an embodiment of the present inventive concept.

FIG. 8 is an enlarged cross-sectional view of area B of FIG. 5.

Referring to FIG. 8, a top surface RLb of the filling member RL may be in direct contact with the fourth bonding member AM4, a bottom surface RLa of the filling member RL may be in direct contact with the fifth bonding member AM5, and a side surface RLs of the filling member RL may be in direct contact with a side surface LP2 of the second metal plate LP2. The bottom surface RLa of the filling member RL may protrude further downward beyond a bottom surface LP2a of the second metal plate LP2, and the filling member RL may partially cover the bottom surface LP2a of the second metal plate LP2. A width W1 of the filling member RL protruding further downward beyond the bottom surface LP2a of the second metal plate LP2 may be greater than a width W1 of the filling member RL overlapping the second metal plate LP2 in the horizontal direction (second direction DR2 in FIG. 3). A thickness h2 of the filling member RL may be greater than a thickness h1 of the adjacent second metal plate LP2. The width W1 of the filling member RL protruding further downward beyond the bottom surface LP2a of the second metal plate LP2 of the filling member RL may be larger than the width of the through hole PH.

The fifth bonding member AM5 may be in direct contact with the entire bottom surface RLa of the filling member RL, the side surface of the filling member RL protruding further downward beyond the bottom surface LP2a of the second metal plate LP2, and a part of the bottom surface LP2a of the second metal plate LP2. A side surface AM5s of the fifth bonding member AM5 may be located outside the side surface of the filling member RL protruding further downward beyond the bottom surface LP2a of the second metal plate LP2, and a width W2 of the fifth bonding member AM5 may be larger than the width W1 of the filling member RL. As in the above-described embodiment, the fifth bonding member AM5 is in contact with the entire bottom surface RLa of the filling member RL and also is in contact with a part of the bottom surface LP2a of the second metal plate LP2. Accordingly, the second metal plate LP2 and the filling member RL are indirectly bonded through the fifth bonding member AM5. Thus, it is possible to prevent the filling member RL from escaping from the through hole PH, thereby enhancing the durability of the display device.

The fingerprint sensor 400 includes an active area SA through which ultrasonic waves are emitted or received, and an inactive area NSA through which no ultrasonic waves are emitted or received. The width W1 of the filling member RL may be larger than a width WSA of the active area SA. A width W3 of the fingerprint sensor 400 may be smaller than the width W2 of the fifth bonding member AM5.

As in the above-described embodiment, a structure in which the filling member RL partially covers and contacts the bottom surface of the second metal plate LP2 may be formed in a process of forming the filling member RL in the through hole PH of the second metal plate LP2.

Figure 9:
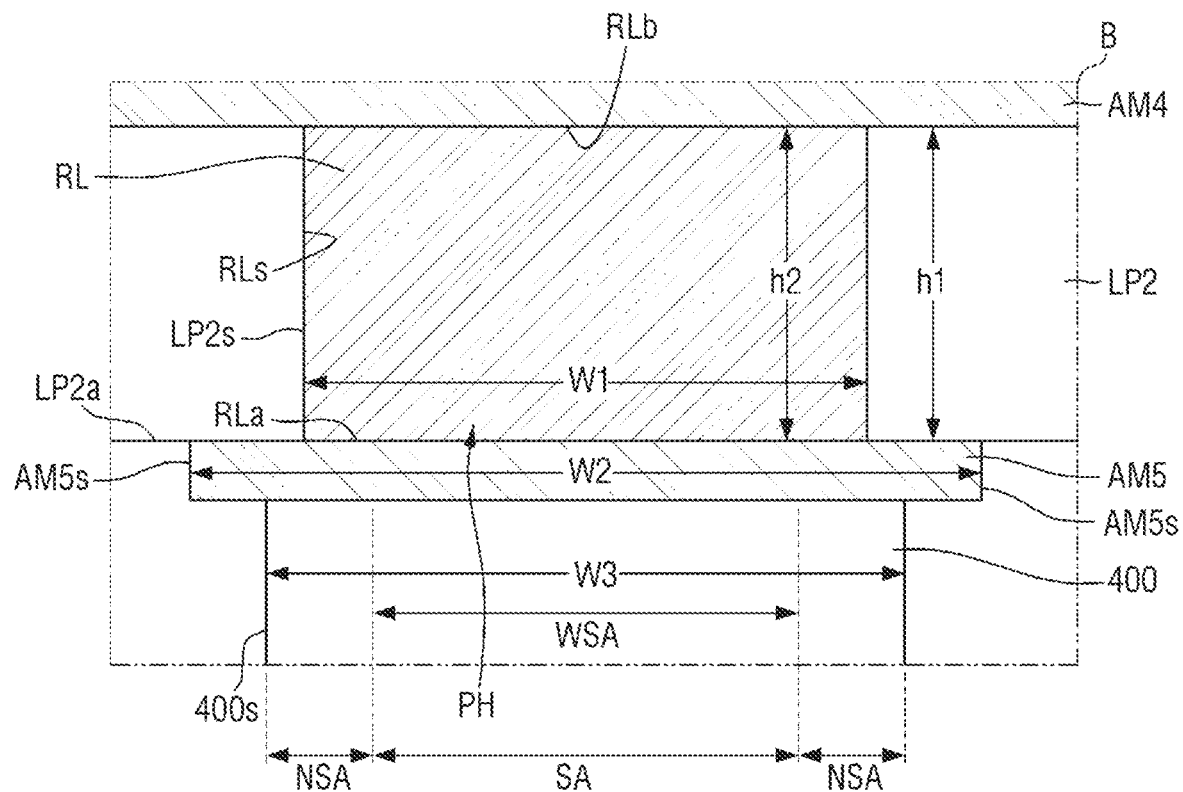
FIG. 9 is a cross-sectional view showing a modified example of the filling member of FIG. 8 according to an embodiment of the present inventive concept.

FIG. 9 is a cross-sectional view showing a modified example of the filling member of FIG. 8.

Referring to FIG. 9, the width W1 of the filling member RL may have a constant value in the thickness direction. The thickness h2 of the filling member RL may be the same as the thickness h1 of the adjacent second metal plate LP2. The bottom surface RLa of the filling member RL and the bottom surface LP2a of the second metal plate LP2 may be located on the same line at the same height from the bottom surface of the fourth bonding member AM4.

Figure 10:
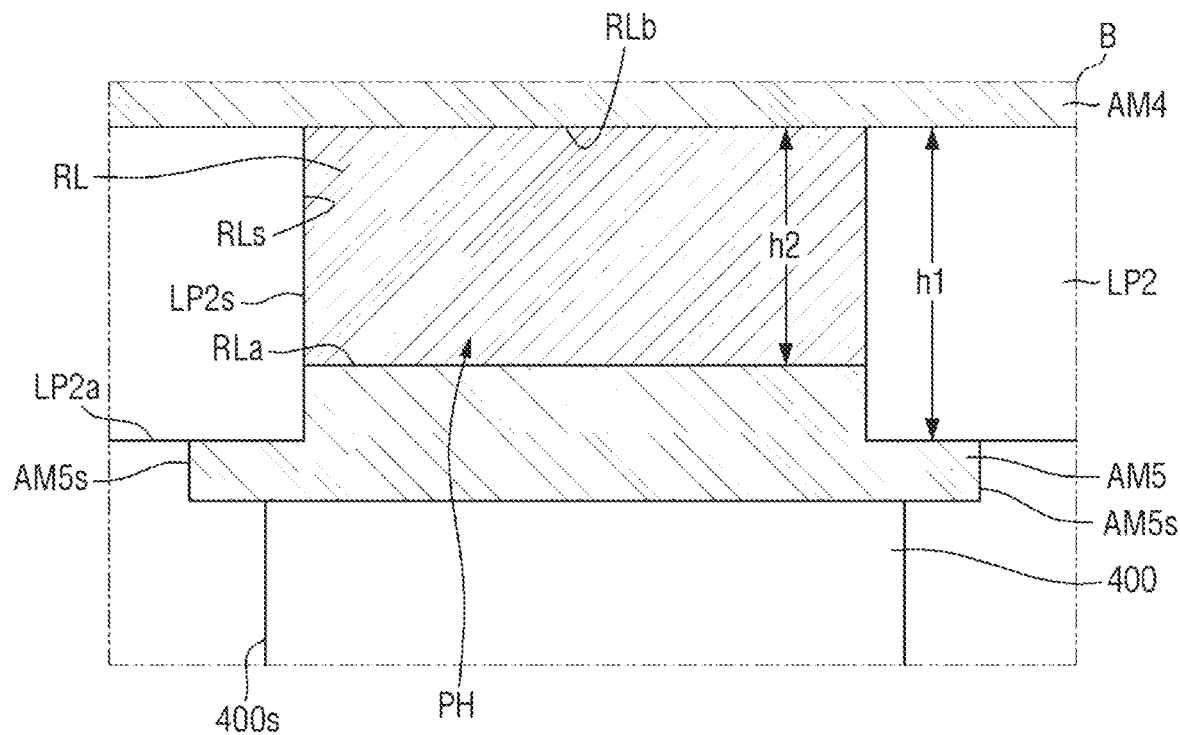
FIG. 10 is a cross-sectional view showing a modified example of the filling member of FIG. 8 according to an embodiment of the present inventive concept.

FIG. 10 is a cross-sectional view showing a modified example of the filling member of FIG. 8.

FIG. 10 illustrates that the bottom surface LP2a of the second metal plate LP2 protrudes further downward than the bottom surface RLa of the filling member RL, and the thickness h2 of the filling member RL may be smaller than the thickness h1 of the second metal plate LP2.

Figure 11:
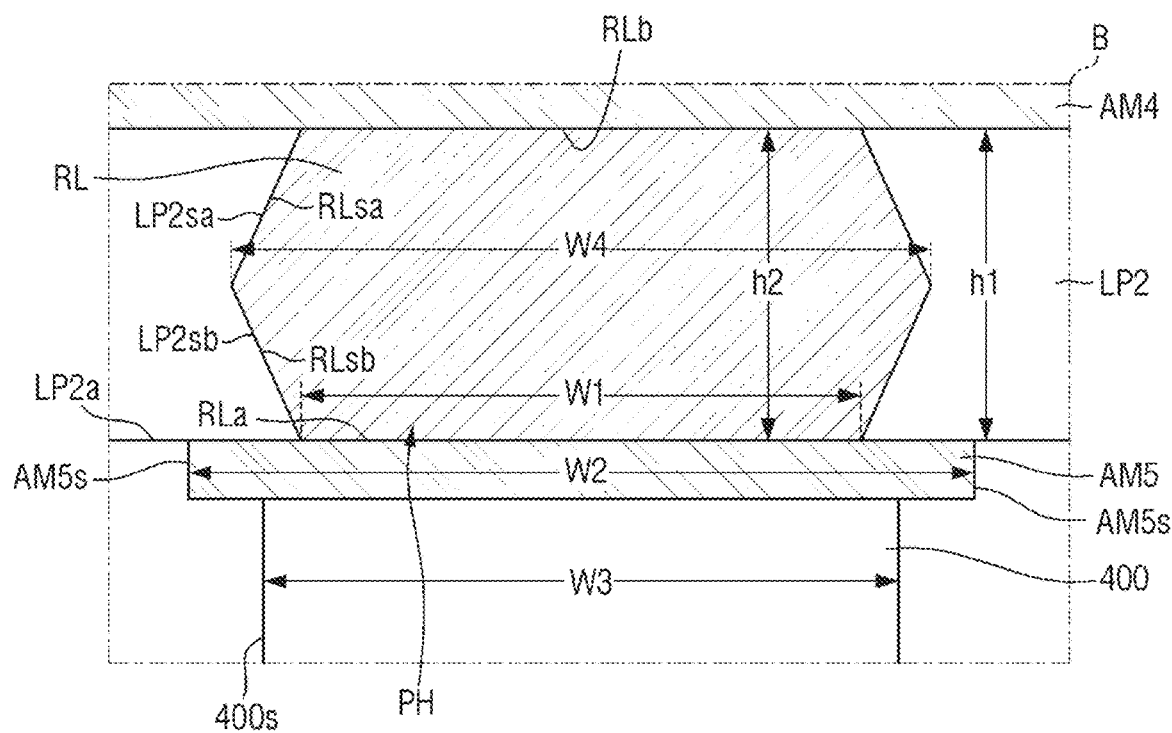
FIG. 11 is a cross-sectional view showing a modified example of the filling member of FIG. 8 according to an embodiment of the present inventive concept.
Figure 12:
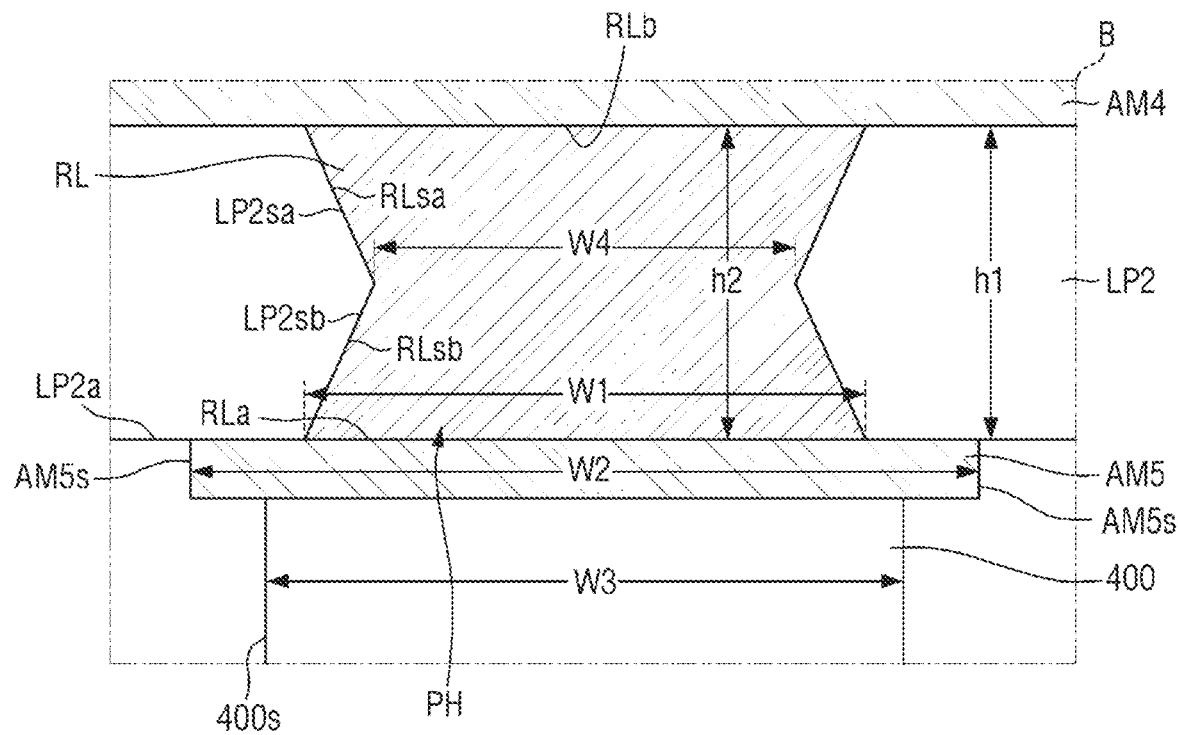
FIG. 12 is a cross-sectional view showing a modified example of the filling member of FIG. 8 according to an embodiment of the present inventive concept.

FIG. 11 is a cross-sectional view showing a modified example of the filling member of FIG. 8. FIG. 12 is a cross-sectional view showing a modified example of the filling member of FIG. 8.

In the modified examples of the filling member RL of FIGS. 11 and 12, the width of the filling member RL may be differently applied according to the thickness direction to prevent the filling member RL from escaping from (or falling off) the through hole PH.

Referring to FIG. 11, each of a width W1 of the top surface RLb of the filling member RL in contact with the fourth bonding member AM4 and a width W1 of the bottom surface RLa of the filling member RL in contact with the fifth bonding member AM5 may be smaller than a width W4 of an intermediate surface positioned between the top surface RLb and the bottom surface RLa of the filling member RL. The intermediate surface may be located at an intermediate point in the thickness direction between the top surface RLb and the bottom surface RLa.

An upper side surface RLsa of the filling member RL in contact with an upper side surface LP2sa of the second metal plate LP2 and a lower side surface RLsb of the filling member RL in contact with a lower side surface LP2sb of the second metal plate LP2 may have different slopes. The upper side surface RLsa of the filling member RL positioned on the left may extend in a left-downward direction from a top surface RL3b thereof, and the lower side surface RLsb of the filling member RL positioned on the left may extend in a left-upward direction from a bottom surface RL3a thereof. The upper side surface LP2sa and the lower side surface LP2sb of the second metal plate LP2 may have shapes corresponding to the upper side surface RLsa and the lower side surface RLsb of the filling member RL in contact therewith, respectively. In the present embodiment, the width of the through hole PH may increase and then decrease from the top to the bottom.

In accordance with the filling member RL according to the present modified example, the filling member RL is disposed to overlap the lower side surface LP2sb of the second metal plate LP2 in the thickness direction while increasing the contact area between the upper side surface RLsa and the upper side surface LP2sa of the second metal plate LP2 and the contact area between the lower side surface RLsb and the lower side surface LP2sb of the second metal plate LP2. Accordingly, it is possible to prevent the filling member RL from escaping from the through hole PH, thereby improving the reliability of the display device.

On the contrary, according to the filling member RL of FIG. 12, shapes of the upper side surface RLsa and the lower side surface RLsb may be symmetrical with respect to an imaginary line connecting a contact point between the upper side surface RLsa and the fourth bonding member AM4 and a contact point between the lower side surface RLsb and the fifth bonding member AM5. In the present embodiment, the width of the through hole PH may decrease and then increase from the top to the bottom.

Figure 13:
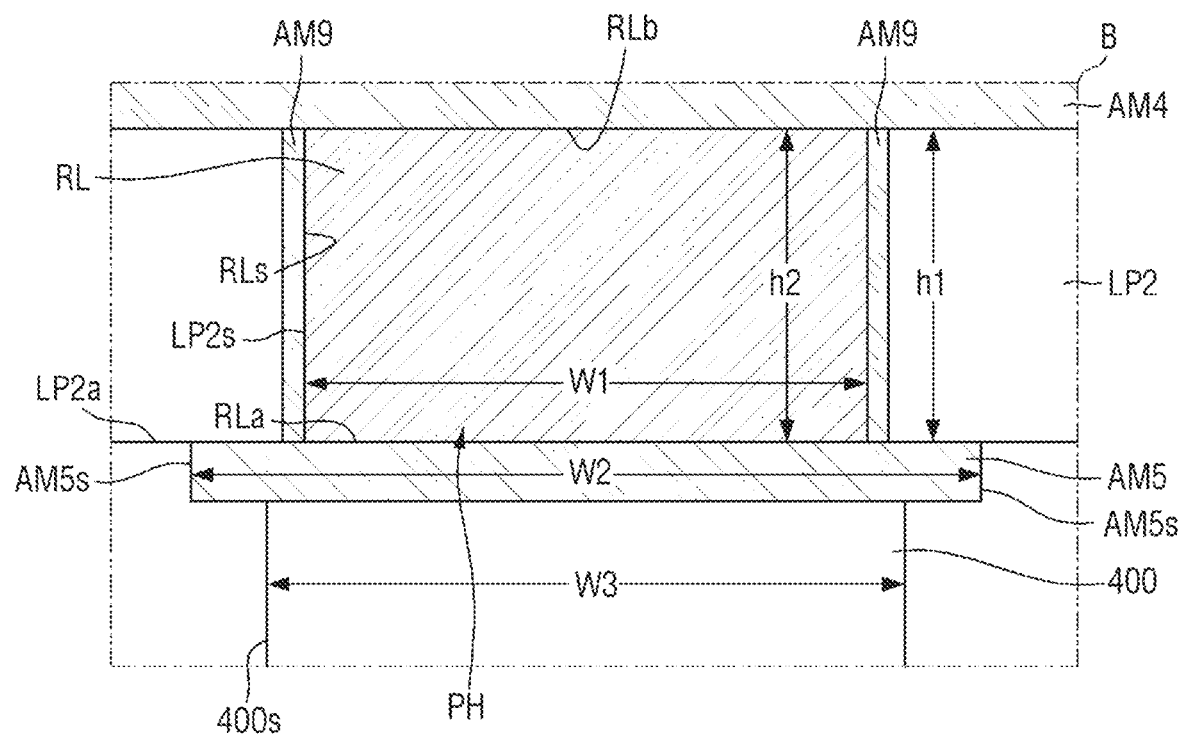
FIG. 13 is a cross-sectional view illustrating a partial area of a cross-sectional view of a display device according to an embodiment of the present inventive concept.

FIG. 13 is a cross-sectional view illustrating a partial area of a cross-sectional view of a display device according to another embodiment.

Referring to FIG. 13, the present embodiment is different from the display device of FIG. 8 in that the side surface RLs of the filling member RL and the side surface LP2s of the second metal plate LP2 may be bonded through a separate ninth bonding member AM9.

The type of the ninth bonding member AM9 may be one of the exemplified types of the first bonding member AM1 described above, but is not limited thereto, and may be a double-sided tape. Since the side surface RLs of the filling member RL and the side surfaces LP2s of the second metal plate LP2 are bonded through the separate ninth bonding member AM9, it is possible to increase a bonding force between the filling member RL and the second metal plate LP2, thereby preventing the filling member RL from escaping from the through hole PH.

Figure 14:
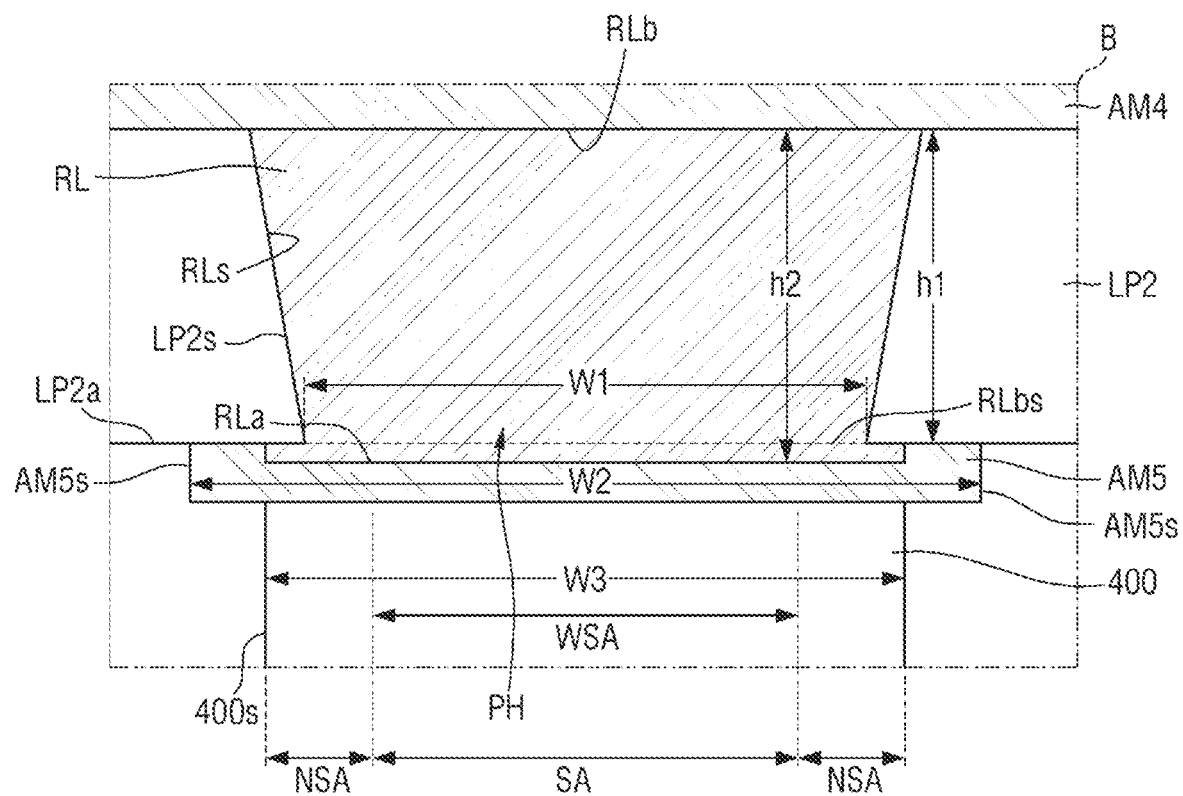
FIG. 14 is a cross-sectional view showing a modified example of the filling member of FIG. 8 according to an embodiment of the present inventive concept.

FIG. 14 is a cross-sectional view showing a modified example of the filling member of FIG. 8.

Referring to FIG. 14, it is different from the filling member RL of FIG. 8 in that the side surface RLs of the filling member RL is inclined downward from the top surface RLb to the bottom surface RLa. The cross-sectional shape of the filling member RL according to the present embodiment may be an inverted trapezoid. In the present embodiment, the width of the through hole PH may decrease from the top to the bottom. According to the present embodiment, the contact area between the side surface RLs of the filling member RL and the side surface LP2s of the adjacent second metal plate LP2 can be increased, thereby preventing the filling member RL from escaping from the through hole PH.

Figure 15:
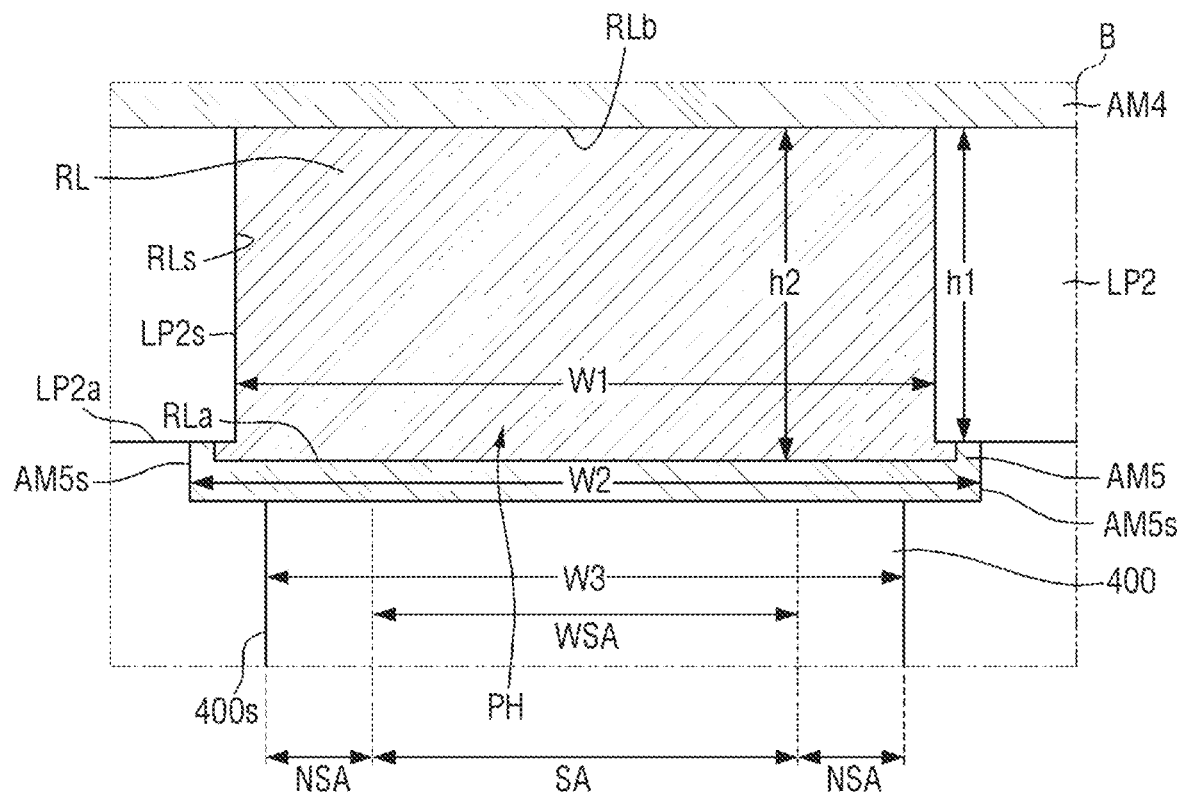
FIG. 15 is a cross-sectional view showing a modified example of the filling member of FIG. 8 according to an embodiment of the present inventive concept.

FIG. 15 is a cross-sectional view showing a modified example of the filling member of FIG. 8.

Referring to FIG. 15, it is different from the filling member RL of FIG. 8 in that the width W1 of the filling member RL is larger than the width W3 of the fingerprint sensor 400. According to the present embodiment, the filling member RL is not only larger than the width WSA of the active area SA, but also covers the inactive area NSA, so that ultrasonic waves transmitted from the active area SA can be provided more efficiently.

Figure 16:
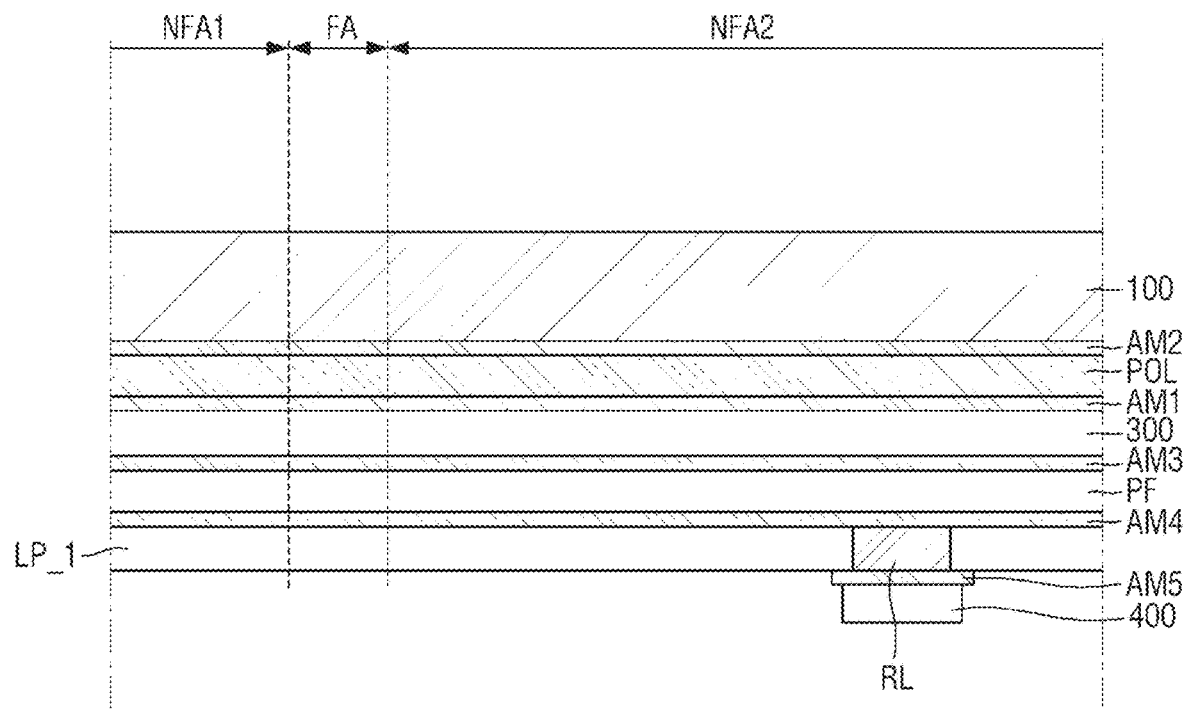
FIG. 16 is a cross-sectional view of a display device according to according to an embodiment of the present inventive concept.

FIG. 16 is a cross-sectional view of a display device according to still another embodiment.

Referring to FIG. 16, the present embodiment is different from the metal plate LP of FIG. 5 in that a metal plate LP_1 is integrally formed. Unlike the metal plate LP of FIG. 5, the metal plate LP_1 according to the present embodiment may be formed in a whole shape in all areas. In reduce the stress of the metal plate LP in the folding area FA, which is caused by folding, the metal plate LP_1 according to the present embodiment may generally have a thickness smaller than that of the metal plate LP shown in FIG. 5. Alternatively, unlike FIG. 16, the thickness of the metal plate LP_1 in the folding area FA may be formed to be thinner than the thickness of the metal plate LP_1 in the adjacent non-folding areas NFA1 and NFA2.

In some embodiments, separate layers may be further disposed between the metal plate LP_1 and the protective layer PF. The layers include at least one functional layer. The functional layer may be a layer that performs a heat dissipation function, an electromagnetic shielding function, a grounding function, a buffering function, a rigidity enhancing function, a supporting function, and/or a digitizing function.

Figure 17:
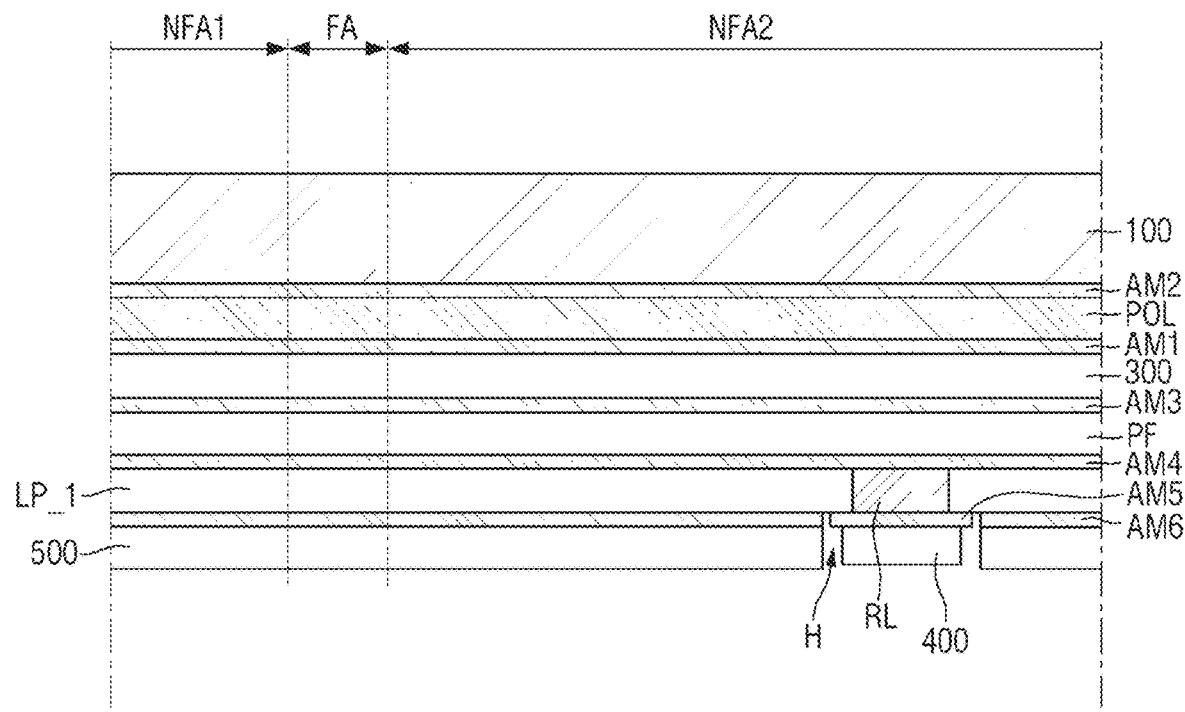
FIG. 17 is a cross-sectional view of a display device according to an embodiment of the present inventive concept.
Figure 18:
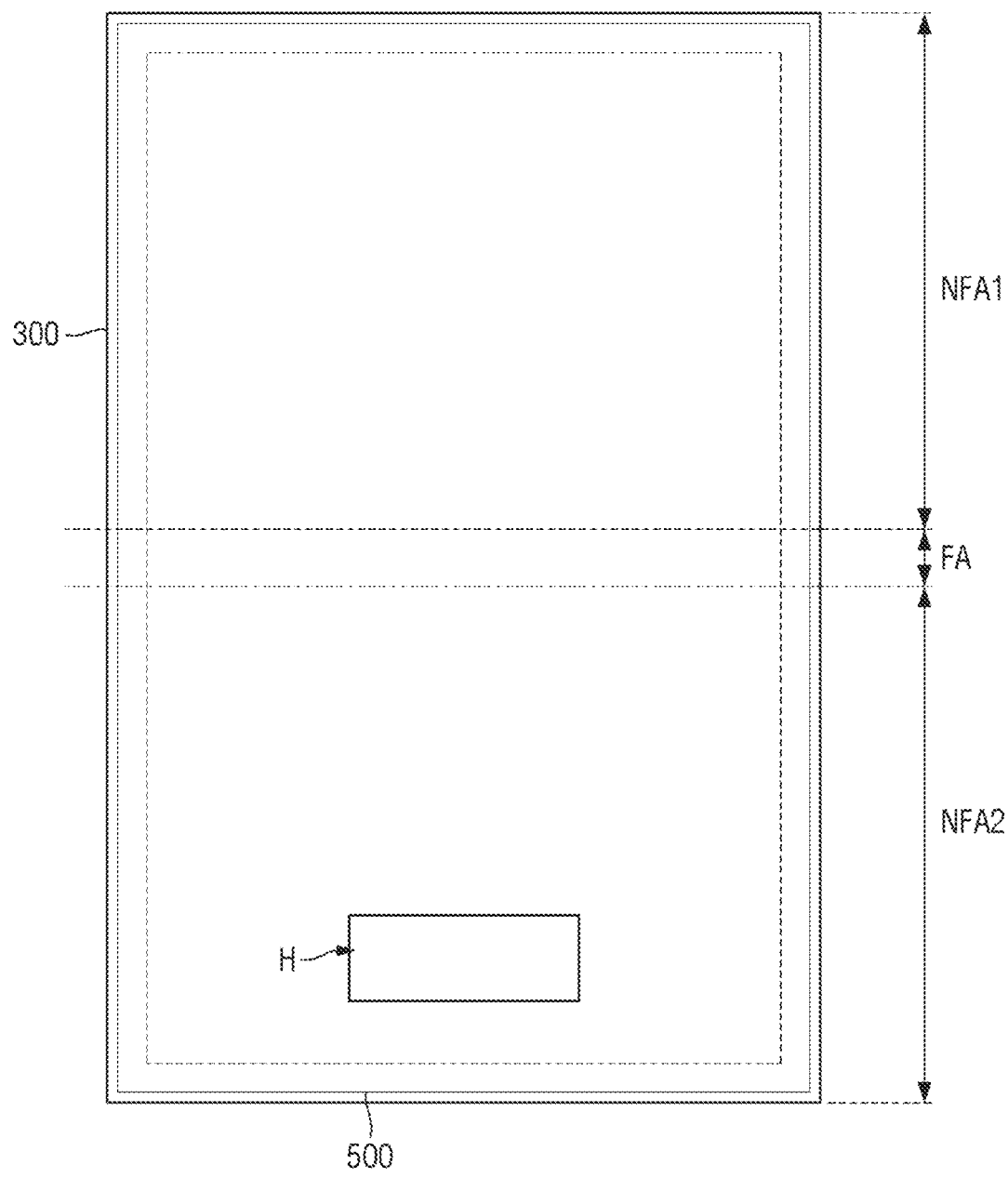
FIG. 18 is a plan view illustrating a lower panel sheet and a display panel of FIG. 17 according to an embodiment of the present inventive concept.

FIG. 17 is a cross-sectional view of a display device according to still another embodiment. FIG. 18 is a plan view illustrating a lower panel sheet and a display panel of FIG. 17.

Referring to FIGS. 17 and 18, a display device according to the present embodiment is different from the display device according to FIG. 5 in that a lower panel sheet 500 may be disposed on the bottom surface of the metal plate LP_1.

More specifically, the metal plate LP_1 may be disposed between the lower panel sheet 500 and the display panel 300. The lower panel sheet 500 may include a sheet hole H completely penetrating from the top surface to the bottom surface of the lower panel sheet 500 in a region overlapping the fingerprint sensor 400 in the thickness direction. The fingerprint sensor 400 may be bonded to the bottom surface of the filling member RL through the fifth bonding member AM5 in the sheet hole H. When the display device 10 is viewed in a plan view, the sheet hole H may be completely surrounded by materials forming a lower panel sheet 500_2.

The lower panel sheet 500 includes at least one functional layer. The functional layer may be a layer that performs a heat dissipation function, an electromagnetic shielding function, a grounding function, a buffering function, a rigidity enhancing function, a supporting function, and/or a digitizing function. The functional layer may be a sheet layer, a film layer, a thin layer, a coating layer, a panel, a plate, or the like. One functional layer may consist of a single layer or a stack of multiple thin films or coating layers. The functional layer may be, for example, a supporting member, a heat dissipation layer, an electromagnetic shielding layer, an impact absorbing layer, a digitizer, or the like. In an embodiment, the lower panel sheet 500 may include an impact absorbing layer. In some embodiments, the lower panel sheet 500 may include an impact absorbing layer (or cushion layer) and a heat dissipation layer. In some other embodiments, the lower panel sheet 500 may include two functional layers selected from a supporting member, a heat dissipation layer, an embossed layer, an electromagnetic shielding layer, an impact absorbing layer, and a digitizer as described above, or three or more functional layers.

In some other embodiments, separate layers may be further disposed between the metal plate LP and the protective layer PF. The layers may be at least one of the exemplified functional layers of the lower panel sheet 500 described above.

Figure 19:
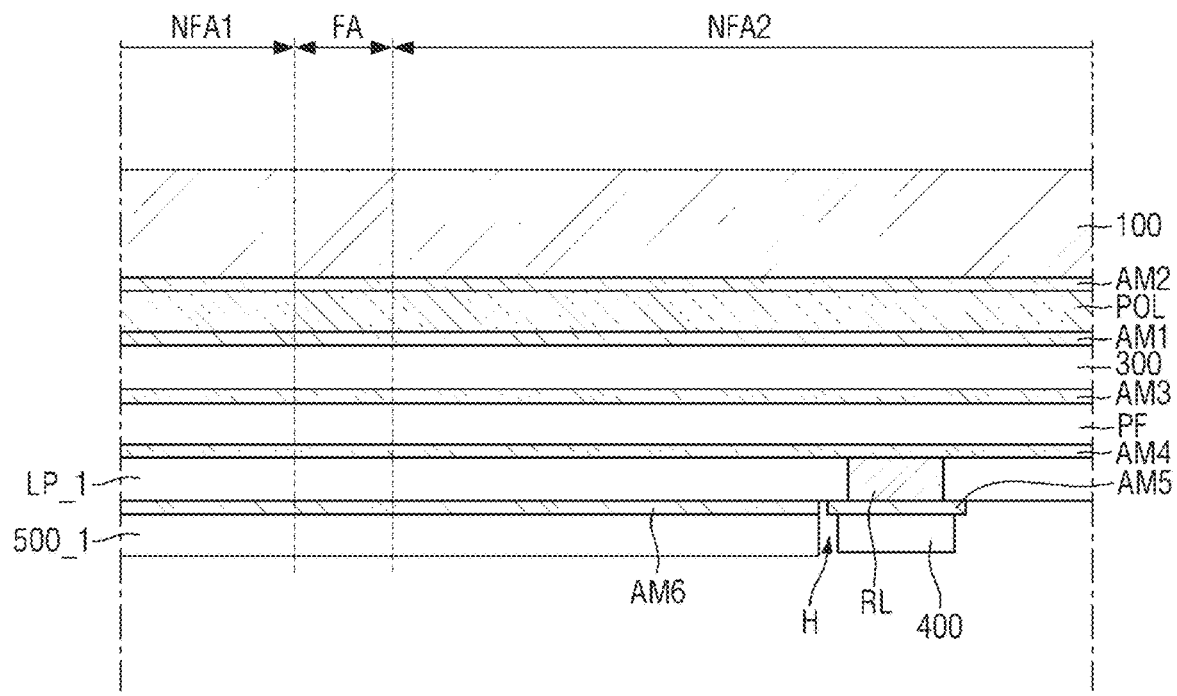
FIG. 19 is a cross-sectional view of a display device according to an embodiment of the present inventive concept.

FIG. 19 is a cross-sectional view of a display device according to still another embodiment.

Referring to FIG. 19, the display device according to the present embodiment is different from the display device according to FIG. 18 in that a lower panel sheet 500_1 is disposed only on one side of the fingerprint sensor 400 and is not disposed on the other side opposite to the one side.

Figure 20:
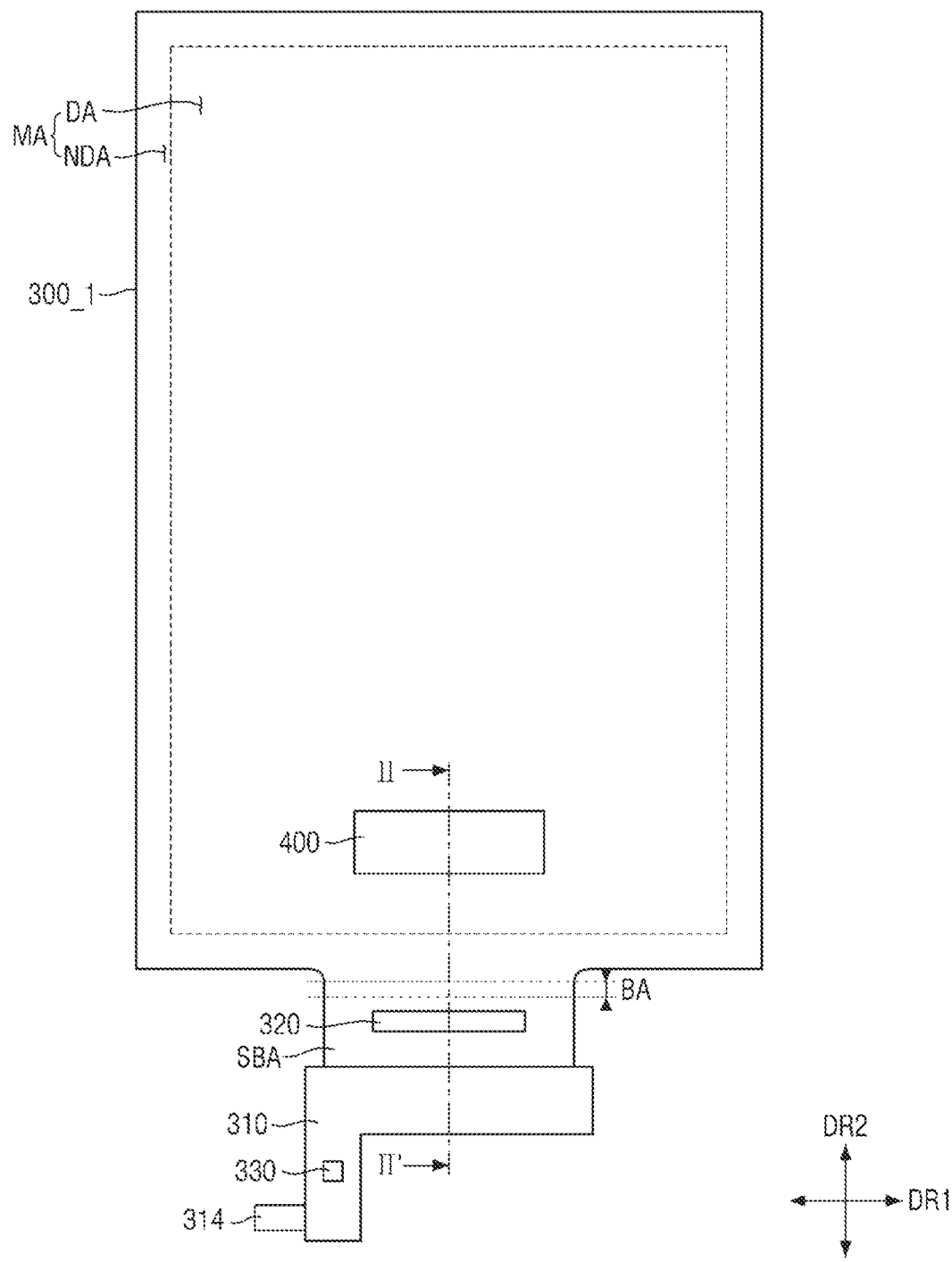
FIG. 20 is a plan view of a display device according to an embodiment of the present inventive concept.
Figure 21:
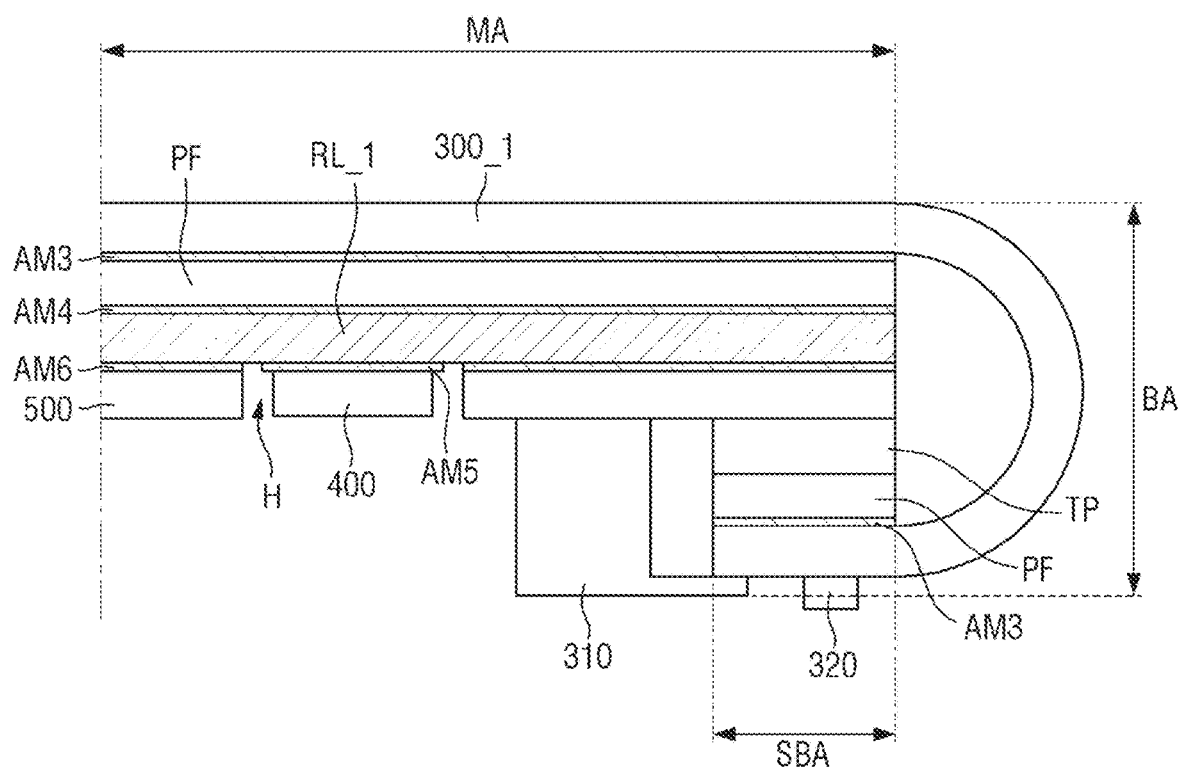
FIG. 21 is a cross-sectional view of a part of a main region, a bending region, and a part of a sub-region of FIG. 20 according to an embodiment of the present inventive concept.

FIG. 20 is a plan view of a display device according to still another embodiment. FIG. 21 is a cross-sectional view of a part of a main region, a bending region, and a part of a sub-region of FIG. 20.

The display device of FIGS. 20 and 21 is different from the display device of FIGS. 1 to 8 in that the display device of the FIGS. 20 and 21 is not foldable, and does not include a metal plate. In the description of the display device of FIGS. 20 and 21, a redundant description of the contents described with reference to FIGS. 1 to 8 will be omitted except for portions that are different from those described with reference to FIGS. 1 to 8.

Referring to FIGS. 20 and 21, a display panel 300_1 according to the present embodiment may be a panel that has a folded state in the bending region BA unlike the display panel 300 of FIGS. 1 to 8 in which folding/non-folding is freely performed.

As illustrated in FIG. 21, the protective layer PF may be disposed on the bottom surface of the display panel 300_1 in the main region MA and the sub-region SBA, and may not be disposed in the bending region BA. In an embodiment, a portion of the display panel 300_1 in the main region MA may vertically overlap a portion of the display panel 300_1 in the sub-region SBA. For example, the main region MA may vertically overlap the sub-region SBA. The term "vertically" may refer to a thickness direction of the display device. The display device having the display panel 300_1 may be in the folded state in the final product, and such overlapping may increase the thickness of the display device, but reduce the width of the display device.

A filling member RL_1 may be bonded to the bottom surface of the protective layer PF in the main region MA. The filling member RL_1 may be disposed over the whole surface of the bottom surface of the protective layer PF. The filling member RL_1 may not be disposed in the bending region BA. The lower panel sheet 500 may be disposed on the bottom surface of the filling member RL_1. The lower panel sheet 500 may be disposed in the main region MA except for the sheet hole H, and may not be disposed in the bending region BA. In an embodiment, the lower panel sheet 500 may be provided with the sheet hole H which exposes the bottom surface of the filling member RL_1. In the sub-region SBA, a spacer TP is interposed between the lower panel sheet 500 and the protective layer PF to compensate for a level difference. The other side surfaces of the spacer TP and of the third bonding member AM3 may be aligned at the end of the sub-region SBA. One end of the display circuit board 310 may be attached to one surface of the display panel 300_1 and the other end thereof may be attached to the bottom surface of the lower panel sheet 500.

According to the present embodiment, the filling member RL_1 having a higher strength (e.g., a hardness) than the fifth bonding member AM5 is located between the fingerprint sensor 400 and the display panel 300_1, so that the display panel 300_1 may be prevented from being pressed when the fingerprint sensor 400 is attached.

Figure 22:
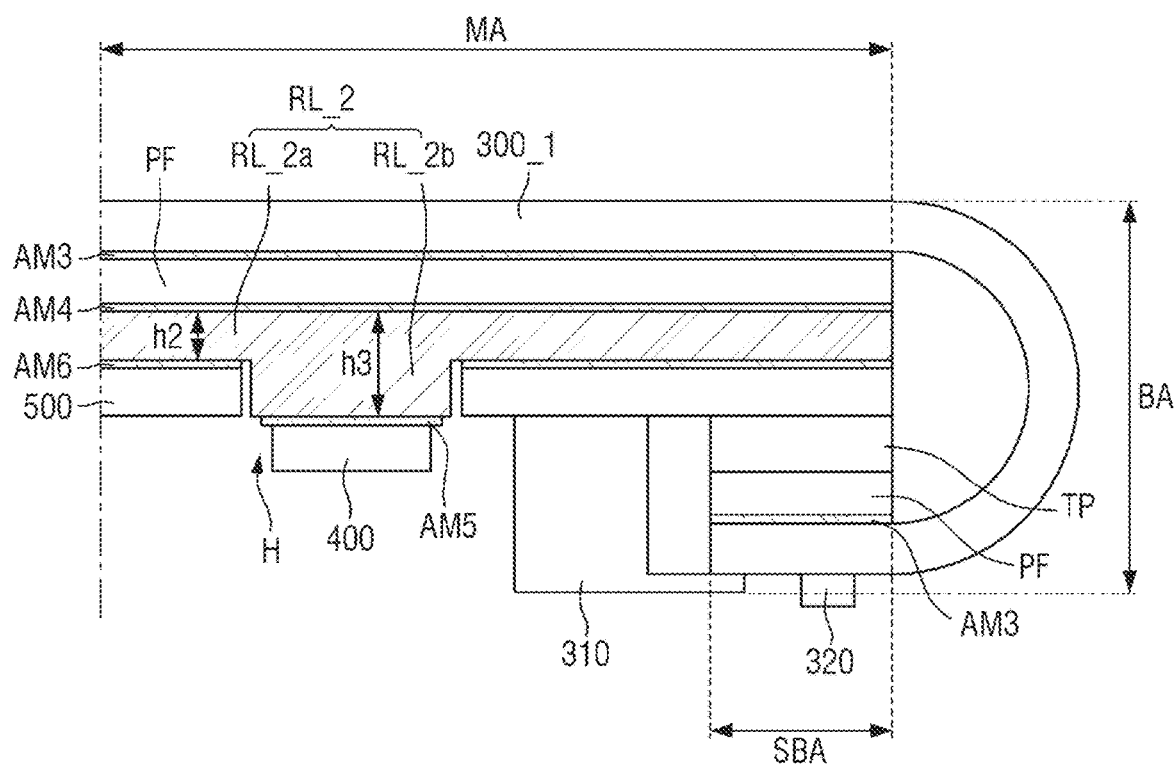
FIG. 22 is a cross-sectional view of a display device according to an embodiment of the present inventive concept.

FIG. 22 is a cross-sectional view of a display device according to still another embodiment.

Referring to FIG. 22, it is different from the display device of FIG. 21 in that a filling member RL_2 may have a portion, with a thickness h3, overlapping the fingerprint sensor 400 in the thickness direction. The thickness h3 of the portion of the filling member RL_2 may be different from that of the other portion of the filling member RL_2. For example, the thickness h3 of the portion of the filling member RL_2b overlapping the fingerprint sensor 400 may be greater than a thickness h2 of the other portion of the filling member RL_2a which does not overlap the fingerprint sensor 400. In some embodiments, the thickness h3 of the filling member RL_2 overlapping the fingerprint sensor 400 may be smaller than the thickness h2 of the filling member RL_2 not overlapping the fingerprint sensor 400.

Figure 23:
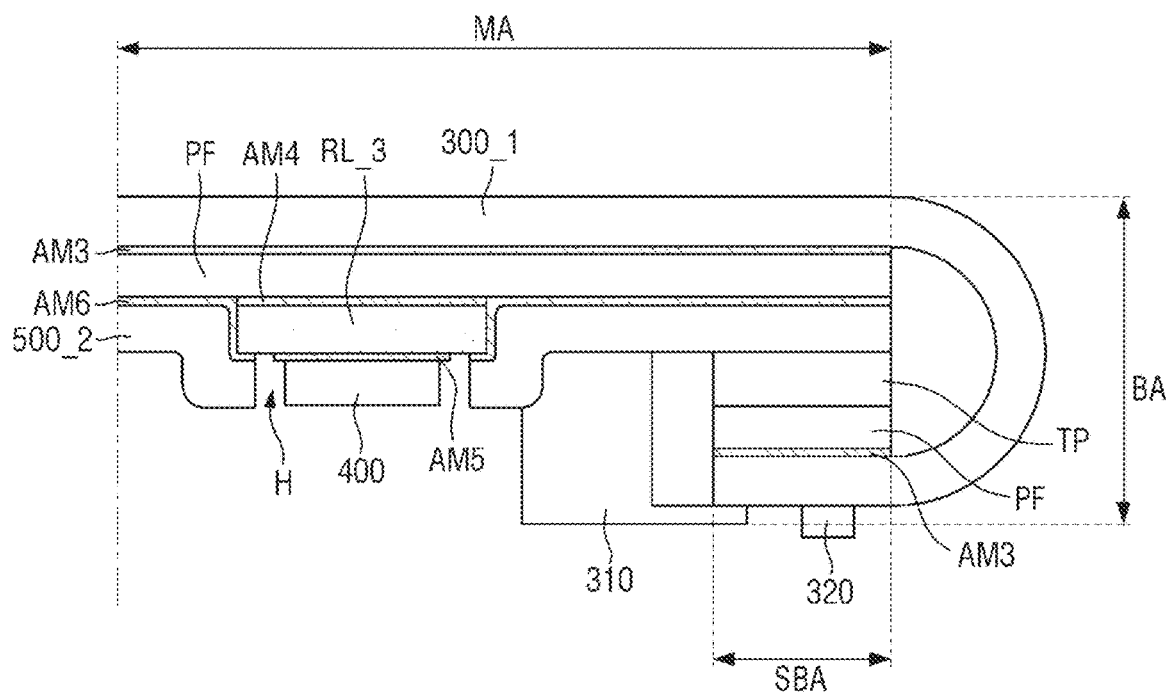
FIG. 23 is a cross-sectional view of a display device according to an embodiment of the present inventive concept.

FIG. 23 is a cross-sectional view of a display device according to still another embodiment.

Referring to FIG. 23, the display device according to the present embodiment is different from the display device of FIG. 21 in that a filling member RL_3 is not disposed on the entire surface of the main region MA, and is disposed only in a region overlapping the fingerprint sensor 400.

The sheet hole H of the lower panel sheet 500_2 may have a width smaller than that of the filling member RL_3. Accordingly, a part of the lower panel sheet 500_2 may overlap the filling member RL_3 in the thickness direction, and the remaining parts that do not overlap the filling member RL_3 may cover the side surface of the filling member RL_3 while conformally reflecting a step due to the filling member RL_3, as shown in FIG. 23, and may be bonded to the bottom of the display panel 300_1 (if there is a separate bonding member between the display panel 300_1 and the filling member RL_3, the remaining parts being adhered to the bonding member).

Figure 24:
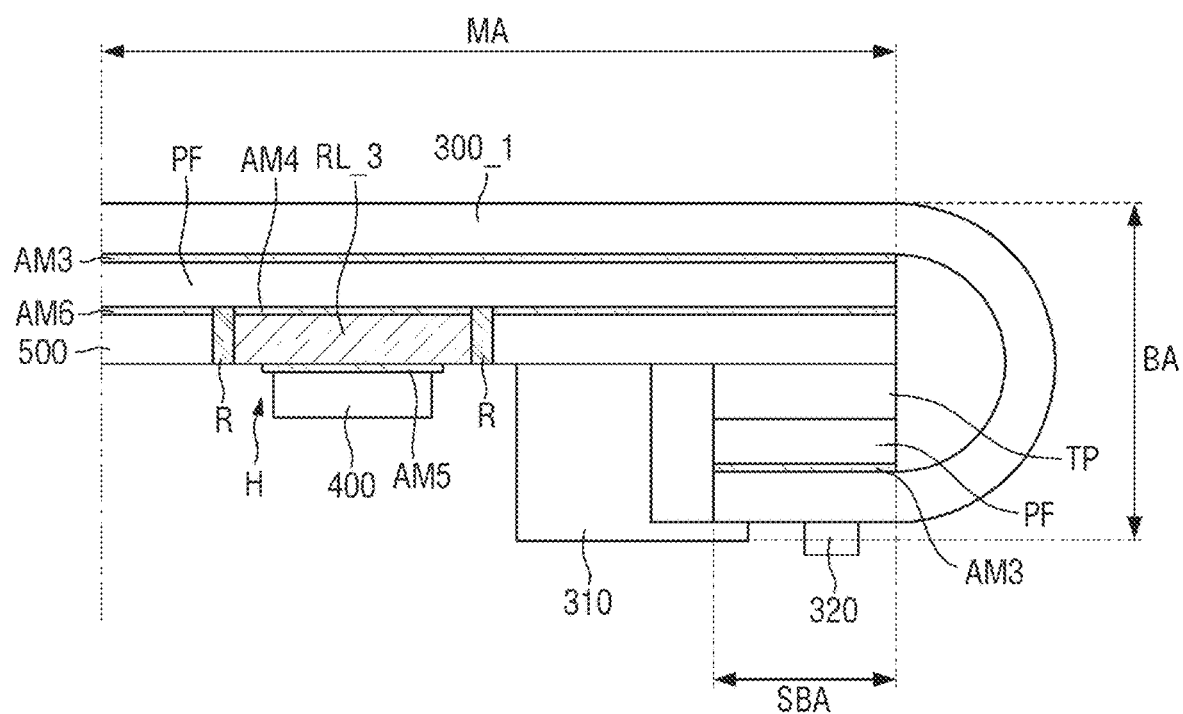
FIG. 24 is a cross-sectional view of a display device according to an embodiment of the present inventive concept.

FIG. 24 is a cross-sectional view of a display device according to still another embodiment.

Referring to FIG. 24, in the display device according to the present embodiment, the lower panel sheet 500 may be bonded to the bottom of the display panel 300_1, and a sheet hole H of the lower panel sheet 500 may have a width larger than that of the filling member RL_3. The lower panel sheet 500 may not overlap the filling member RL_3 in the thickness direction. As shown in FIG. 24, the filling member RL_3 and the lower panel sheet 500 may be spaced apart from each other with a predetermined gap, and a resin R may be further disposed in the gap. The resin R serves as a member-inner surface bonding member for bonding a side surface (or inner side surface) of the lower panel sheet 500 and a side surface of the filling member RL_3, which are spaced apart from each other. In accordance with the display device according to the present embodiment, since the resin R is further disposed in the gap between the filling member RL_3 and the lower panel sheet 500, the gap may be prevented from being visually recognized from the outside.

Although embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A display device comprising:
a display panel;
a metal plate disposed on a bottom surface of the display panel and configured to support the display panel;
a filling member disposed on the bottom surface of the display panel,
wherein a material of the metal plate is different from a material of the filling member;
a fingerprint sensor disposed on a bottom surface of the filling member; and
a first adhesive layer disposed between the fingerprint sensor and the filling member to bond the fingerprint sensor to the filling member,
wherein the metal plate comprises a first surface facing the display panel and a second surface opposite to the first surface,
wherein a through hole is defined in the metal plate,
wherein the through hole extends from the first surface of the metal plate to the second surface of the metal plate,
wherein the filling member includes a portion disposed in the through hole, and
wherein a width of the first adhesive layer in a first direction substantially parallel to the first surface of the metal plate is larger than a width of the through hole in the first direction.

2. The display device of claim 1,
wherein the width of the first adhesive layer in the first direction is larger than a width of the fingerprint sensor in the first direction.

3. The display device of claim 2,
wherein the width of the fingerprint sensor in the first direction is larger than the width of the through hole in the first direction.

4. The display device of claim 1,
wherein the width of the first adhesive layer in the first direction is larger than a width of the filling member in the first direction.

5. The display device of claim 4,
wherein a width of the fingerprint sensor in the first direction is larger than a width of the filling member in the first direction.

6. The display device of claim 1,
wherein the first adhesive layer includes a first portion directly contacting the second surface of the metal plate and a second portion directly contacting the bottom surface of the filling member.

7. The display device of claim 6,
wherein the filling member overlaps the second portion of the first adhesive layer,
wherein the filling member does not overlap the first portion of the first adhesive layer, and
wherein a thickness of the first portion of the first adhesive layer is different from a thickness of the second portion of the first adhesive layer.

8. The display device of claim 6,
wherein the fingerprint sensor directly contacts the first portion of the first adhesive layer and the second portion of the first adhesive layer.

9. The display device of claim 6,
wherein the second portion of the first adhesive layer directly contacts side surfaces of the metal plate which defines the through hole.

10. The display device of claim 1, further comprising:
a second adhesive layer disposed between the display panel and the metal plate, wherein the second adhesive layer directly contacts the first surface of the metal plate, and wherein the portion of the filling member disposed in the through hole directly contacts the second adhesive layer.

11. The display device of claim 1, wherein a portion of the filling member disposed in the through hole directly contacts the metal plate.

12. The display device of claim 1, wherein a hardness of the filling member is 10 times or more a hardness of the first adhesive layer, and wherein a hardness of the metal plate is greater than the hardness of the filling member.

13. The display device of claim 1, wherein the width of the through hole decreases from the first surface of the metal plate to the second surface of the metal plate.

14. The display device of claim 1, wherein the width of the through hole decreases from the first surface of the metal plate to a first point of the through hole which is disposed between the first surface of the metal plate and the second surface of the metal plate and then increases from the first point to the second surface of the metal plate.

15. The display device of claim 1, wherein the width of the through hole increases from the first surface of the metal plate to a first point of the through hole which is disposed between the first surface of the metal plate and the second surface of the metal plate and then decreases from the first point to the second surface of the metal plate.

16. The display device of claim 1, wherein the fingerprint sensor includes an ultrasonic fingerprint sensor, and wherein the ultrasonic fingerprint sensor is configured to compare an incident ultrasonic wave which is transmitted upward from the ultrasonic fingerprint sensor with a fingerprint reflection ultrasonic wave which is reflected from a finger on a top surface of the display panel, which is opposite to the bottom surface of the display panel, and recognize fingerprint of the finger.

17. The display device of claim 1, wherein the fingerprint sensor includes an optical fingerprint sensor, and wherein the filling member has a transmittance of 90% or more for light from the optical fingerprint sensor.

18. The display device of claim 1, wherein a thickness of the filling member is greater than a thickness of the metal plate, and wherein the filling member directly contacts the second surface of the metal plate.

19. The display device of claim 1, wherein the filling member is completely surrounded by the metal plate in a plan view.

20. The display device of claim 1, wherein the display device further comprises a lower panel sheet disposed on the second surface of the metal plate without vertically overlapping the fingerprint sensor.

* * * * *